United States Patent
Watanabe et al.

(10) Patent No.: US 11,072,869 B2
(45) Date of Patent: Jul. 27, 2021

(54) MANGANESE/NICKEL COMPOSITE OXIDE PARTICLES AND PROCESS FOR PRODUCING THE MANGANESE NICKEL COMPOSITE OXIDE PARTICLES, POSITIVE ELECTRODE ACTIVE SUBSTANCE PARTICLES FOR NON-AQUEOUS ELECTROLYTE SECONDARY BATTERIES AND PROCESS FOR PRODUCING THE POSITIVE ELECTRODE ACTIVE SUBSTANCE PARTICLES, AND NON-AQUEOUS ELECTROLYTE SECONDARY BATTERY

(71) Applicant: TODA KOGYO CORPORATION, Hiroshima (JP)

(72) Inventors: Hiroyasu Watanabe, Kitakyushu (JP); Daisuke Morita, Sanyo Onoda (JP); Manabu Yamamoto, Sanyo Onoda (JP); Kazumichi Koga, Sanyo Onoda (JP); Akihisa Kajiyama, Sanyo Onoda (JP); Hiroaki Masukuni, Sanyo Onoda (JP); Hideaki Sadamura, Sanyo Onoda (JP); Ryuta Masaki, Sanyo Onoda (JP); Kazutoshi Matsumoto, Sanyo Onoda (JP)

(73) Assignee: TODA KOGYO CORPORATION, Hiroshima (JP)

( * ) Notice: Subject to any disclaimer, the term of this patent is extended or adjusted under 35 U.S.C. 154(b) by 0 days.

(21) Appl. No.: 16/057,982

(22) Filed: Aug. 8, 2018

(65) Prior Publication Data
US 2018/0347068 A1    Dec. 6, 2018

Related U.S. Application Data

(62) Division of application No. 14/007,732, filed as application No. PCT/JP2011/080075 on Dec. 26, 2011, now Pat. No. 10,161,057.

(30) Foreign Application Priority Data

Mar. 31, 2011  (JP) ................................ 2011-080116
Mar. 31, 2011  (JP) ................................ 2011-080117
(Continued)

(51) Int. Cl.
*H01M 4/505* (2010.01)
*H01M 4/525* (2010.01)
(Continued)

(52) U.S. Cl.
CPC ............ *C30B 1/10* (2013.01); *C01G 45/1242* (2013.01); *C01G 51/54* (2013.01); *C01G 53/54* (2013.01);
(Continued)

(58) Field of Classification Search
CPC ...... H01M 4/485; H01M 4/502; H01M 4/505; H01M 4/525
See application file for complete search history.

(56) References Cited

U.S. PATENT DOCUMENTS 6,168,888 B1 *  1/2001  Iwata et al.
6,267,943 B1    7/2001  Manev et al.
(Continued)

FOREIGN PATENT DOCUMENTS

JP    2001-146425    5/2001
JP    2002-316823    10/2002
(Continued)

OTHER PUBLICATIONS

JP2009123707 machine translation.*
(Continued)

*Primary Examiner* — Haidung D Nguyen
(74) *Attorney, Agent, or Firm* — Nixon & Vanderhye P.C.

(57) ABSTRACT

The present invention provides a precursor of positive electrode active substance particles for non-aqueous electrolyte secondary batteries which have a high discharge voltage and a high discharge capacity, hardly suffer from side reactions with an electrolyte solution, and are excellent in cycle characteristics, positive electrode active substance particles for non-aqueous electrolyte secondary batteries, and processes for producing these particles, and a non-aqueous electrolyte secondary battery. The present invention relates to positive electrode active substance particles for non-aqueous electrolyte secondary batteries having a spinel structure with a composition represented by the following chemical formula (1), in which the positive electrode active substance particles satisfy the following characteristic (A) and/or characteristic (B) when indexed with Fd-3m in X-ray diffraction thereof: (A) when indexed with Fd-3m in X-ray diffraction of the positive electrode active substance particles, a ratio of I(311) to I(111) [I(311)/I(111)] is in the range of 35 to 43%, and/or (B) when indexed with Fd-3m in X-ray diffraction of the positive electrode active substance particles, a gradient of a straight line determined by a least square method in a graph prepared by plotting sin θ in an abscissa thereof and B cos θ in an ordinate thereof wherein B is a full-width at half maximum with respect to each peak position 2θ (10 to 90°) is in the range of $3.0 \times 10^{-4}$ to $20.0 \times 10^{-4}$; and $$Li_{1+x}Mn_{2-y-z}Ni_yM_zO_4 \qquad \text{Chemical Formula (1)}$$

wherein x, y, z fall within the range of $-0.05 \cdot x \cdot 0.15$, $0.4 \cdot y \cdot 0.6$ and $0 \cdot z \cdot 0.20$, respectively; and M is at least one element selected from the group consisting of Mg, Al, Si, Ca, Ti, Co, Zn, Sb, Ba, W and Bi.

9 Claims, 8 Drawing Sheets

(30) Foreign Application Priority Data

Mar. 31, 2011 (JP) .................................. 2011-080118
Jul. 7, 2011 (JP) .................................. 2011-151283

(51) Int. Cl.

| | |
|---|---|
| *C30B 1/10* | (2006.01) |
| *C01G 45/12* | (2006.01) |
| *C01G 51/00* | (2006.01) |
| *C01G 53/00* | (2006.01) |
| *C30B 1/02* | (2006.01) |

(52) U.S. Cl.
CPC ............... *C30B 1/02* (2013.01); *H01M 4/505* (2013.01); *C01P 2002/54* (2013.01); *C01P 2002/72* (2013.01); *C01P 2004/61* (2013.01); *C01P 2006/12* (2013.01); *C01P 2006/80* (2013.01); *H01M 4/525* (2013.01); *Y10T 428/2982* (2015.01)

(56) References Cited

U.S. PATENT DOCUMENTS

| | | |
|---|---|---|
| 6,924,064 B2 | 8/2005 | Kondo et al. |
| 8,137,847 B2 | 3/2012 | Ohzuku et al. |
| 2006/0121350 A1 | 6/2006 | Kajiya et al. |
| 2013/0032753 A1 | 2/2013 | Yamamoto et al. |

FOREIGN PATENT DOCUMENTS

| | | |
|---|---|---|
| JP | 2003-221236 | 8/2003 |
| JP | 2004-303710 | 10/2004 |
| JP | 2005-108448 | 4/2005 |
| JP | 2005-322480 | 11/2005 |
| JP | 2005-336004 | 12/2005 |
| JP | 2006-004811 | 1/2006 |
| JP | 2007-149414 | 6/2007 |
| JP | 2008-115075 | 5/2008 |
| JP | 2008-258160 | 10/2008 |
| JP | 2009-123707 | 6/2009 |
| JP | 2011-134708 | 7/2011 |
| JP | 2011-198759 | 10/2011 |
| WO | WO 2011/065464 | 6/2011 |
| WO | WO 2011/089697 | 7/2011 |

OTHER PUBLICATIONS

International Search Report issued in PCT/JP2011/080075 dated Mar. 27, 2012.

International Preliminary Report on Patentability issued in PCT/JP2011/080075 dated Oct. 1, 2013.

Amdouni et al., "Structure and insertion properties of disordered and ordered $LiNi_{0.5}Mn_{1.5}O_4$ spinels prepared by wet chemistry" *Ionics* (2006) 12: 117-126.

\* cited by examiner

US 11,072,869 B2

MANGANESE/NICKEL COMPOSITE OXIDE PARTICLES AND PROCESS FOR PRODUCING THE MANGANESE NICKEL COMPOSITE OXIDE PARTICLES, POSITIVE ELECTRODE ACTIVE SUBSTANCE PARTICLES FOR NON-AQUEOUS ELECTROLYTE SECONDARY BATTERIES AND PROCESS FOR PRODUCING THE POSITIVE ELECTRODE ACTIVE SUBSTANCE PARTICLES, AND NON-AQUEOUS ELECTROLYTE SECONDARY BATTERY

This application is a divisional of U.S. application Ser. No. 14/007,732 filed Oct. 18, 2013, which is the U.S. national phase of PCT/JP2011/080075 filed Dec. 26, 2011 which designated the U.S. and claims priority to JP 2011-151283 filed Jul. 7, 2011, and JP 2011-080116, JP 2011-080117, and JP 2011-080118 all filed Mar. 31, 2011, the entire contents of each of which are hereby incorporated by reference.

TECHNICAL FIELD

The present invention relates to positive electrode (cathode) active substance particles for non-aqueous electrolyte secondary batteries which have a high discharge voltage and a high discharge capacity, hardly suffer from side reactions with an electrolyte solution, and are excellent in cycle characteristics and a process for producing the positive electrode active substance particles, manganese/nickel composite oxide particles as a precursor of the positive electrode active substance particles and a process for producing the manganese/nickel composite oxide particles, and a non-aqueous electrolyte secondary battery.

BACKGROUND ART

With the recent rapid development of portable and cordless electronic devices such as audio-visual (AV) devices and personal computers, there is an increasing demand for secondary batteries having a small size, a light weight and a high energy density as a power source for driving these electronic devices. Also, in consideration of global environments, electric cars and hybrid cars have been recently developed and put into practice, so that there is an increasing demand for lithium ion secondary batteries used in large size applications which have excellent storage characteristics. Under these circumstances, the high-energy lithium ion secondary batteries having advantages such as a high discharge voltage and a large discharge capacity have been noticed. In particular, in order to apply the lithium ion secondary batteries to electric tools, electric vehicles or the like in which rapid charge/discharge operations are needed, it has been required that the lithium ion secondary batteries exhibit excellent rate characteristics.

Hitherto, as positive electrode active substances useful for lithium ion secondary batteries exhibiting a 4 V-grade voltage, there are generally known $Li_2MnO_4$ having a spinel type structure, $LiMnO_2$ having a zigzag layer structure, $LiCoO_2$ and $LiNiO_2$ having a layer rock-salt structure, or the like. Among the secondary batteries using these active substances, lithium ion secondary batteries using $LiNiO_2$ have been noticed because of a large discharge capacity thereof.

However, $LiNiO_2$ tends to exhibit a low discharge voltage and tends to be deteriorated in thermal stability upon charging as well as cycle characteristics and rate characteristics, and, therefore, it has been required to further improve properties thereof. In addition, when subjecting $LiNiO_2$ to high-voltage charging to obtain a high capacity, there tends to arise such a problem that the structure thereof is broken.

Also, $LiMnO_2$ is excellent in rate characteristics and cycle characteristics, but exhibit a low discharge voltage and a small discharge capacity, and therefore tends to hardly provide a high-energy positive electrode active substance.

In recent years, the positive electrode active substances having a high discharge voltage have been noticed. Typical examples of the known positive electrode active substances having a high discharge voltage include $LiNi_{0.5}Mn_{1.5}O_4$, $LiCoMnO_4$, $Li_{1.2}Cr_{0.4}Mn_{0.4}O_4$, $Li_{1.2}Cr_{0.4}Ti_{0.4}O_4$, $LiCoPO_4$, $LiFeMnO_4$ and $LiNiVO_4$.

Among these materials, $LiNi_{0.5}Mn_{1.5}O_4$ has such a high discharge voltage that a discharge plateau region thereof is present in the range of not less than 4.5 V, and is excellent in rate characteristics and cycle characteristics. Therefore, $LiNi_{0.5}Mn_{1.5}O_4$ has been especially noticed as a next generation positive electrode active substance.

There is very longtime a continuous demand for positive electrode active substances which have a high voltage and a higher capacity from the standpoint of an adequate energy density and are also capable of satisfying cycle characteristics.

Conventionally, there have been attempted various improvements of positive electrode active substance particles having a composition of $LiNi_{0.5}Mn_{1.5}O_4$ (Patent Documents 1 to 7 and Non-Patent Documents 1 and 2).

CITATION LIST

Patent Literature

Patent Document 1: Japanese Patent Application Laid-open (TOKUHYO) No. 2000-515672
Patent Document 2: Japanese Patent Application Laid-open (KOKAI) No. 9-147867
Patent Document 3: Japanese Patent Application Laid-open (KOKAI) No. 2001-110421
Patent Document 4: Japanese Patent Application Laid-open (KOKAI) No. 2001-185145
Patent Document 5: Japanese Patent Application Laid-open (KOKAI) No. 2002-158007
Patent Document 6: Japanese Patent Application Laid-open (KOKAI) No. 2003-81637
Patent Document 7: Japanese Patent Application Laid-open (KOKAI) No. 2004-349109

Non-Patent Literature

Non-Patent Document 1: "Preliminary Report of 48th Battery Symposium (2007) 2A16"
Non-Patent Document 2: "J. Electrochem. Society", 148(7), A723-A729 (2001)
Non-Patent Document 3: "Chem. Mater.", 16, 906-914 (2004)

SUMMARY OF THE INVENTION

Problem to be Solved by the Invention

At present, it has been strongly required to provide a high-energy positive electrode active substance for non-aqueous electrolyte secondary batteries which has a high discharge voltage, is excellent in discharge capacity and exhibits good cycle characteristics. However, the positive electrode active substance capable of fully satisfying the above requirements has not been obtained until now.

That is, even according to the techniques described in Patent Documents 1 to 7 and Non-Patent Document 1, it is not possible to sufficiently improve properties of secondary batteries such that they can be operated with a high voltage, and can exhibit an excellent discharge capacity and a good long-term stability including cycle characteristics.

In Patent Document 1, it has been reported that nickel-containing lithium manganate particles comprising Ni in the form of a uniform solid solution are obtained by a sol-gel method in which manganese nitrate, nickel nitrate and lithium nitrate are dissolved in ethanol, and after adding carbon black, the resulting solution is mixed with an ammonia solution. However, from the industrial viewpoints, it may be difficult to produce a large amount of the lithium manganate particles by such a production method, and the discharge capacity of the resulting particles is below 100 mAh/g and therefore tends to be unpractical.

In Patent Document 2, it has been reported that a positive electrode substance that can be operated at a high voltage and can exhibit excellent cycle characteristics has been obtained by a solid phase method in which electrolytic manganese dioxide, nickel nitrate and lithium hydroxide are mixed with each other. However, in the discharge curve of the resulting battery, a plateau that will be derived from $Mn^{3+}$ is observed near 4 V, and the capacity due to the plateau exceeds 10 mAh/g. Therefore, the positive electrode substance described in Patent Document 2 tends to be unstable as a positive electrode material for the high-voltage use and therefore tends to be unpractical.

In Patent Document 3, there has been proposed the positive electrode substance that is obtained by baking a gel-like precursor prepared by mixing lithium carbonate, $MnO_2$ and nickel nitrate in an ethanol solvent using a ball mill, and thereafter subjecting the resulting positive electrode substance particles to surface treatment with a compound of F, Cl, Si or S and then baking the surface-treated particles by the same method to allow the particles to exhibit a concentration gradient of the element F, Cl, Si or S toward an outside of the particles, and it has been reported that the resulting battery can maintain good battery characteristics by suppressing the reaction with an electrolyte solution therein by the effects of the above elements added when operated at a high voltage. However, in this method, since F, Cl, Si or S is substituted for Mn or Ni located at a 16d site thereof so that the amount of Mn or Ni at the 16d site is relatively reduced. As a result, the positive electrode active substance particles tend to become brittle upon subjected to charge and discharge cycles, and tend to be unstable as a high-voltage positive electrode material and therefore unpractical. More specifically, F, Cl, Si or S which is present on a surface of the respective positive electrode active substance particles acts as a resistance component, so that the positive electrode active substance particles tend to be deteriorated in charge/discharge capacities as compared to those particles to which none of the above elements are added.

In Patent Document 4, it has been reported that when a manganese compound, a nickel compound and an ammonium compound are co-precipitated to obtain a spherical precursor whose primary particles have an acicular shape and then the precursor is mixed with an Li compound, Ni and Mn are readily reacted with each other to thereby reduce residual Ni (MiC) forming an impurity layer. Although the resulting substance is operated at a high voltage and exhibits a large discharge capacity, only an initial discharge capacity thereof is discussed therein, and there are no descriptions concerning a stability for cycle characteristics and a stability owing to suppression of side reactions with an electrolyte solution which can be achieved by improving surface properties of the particles. In addition, the positive electrode active substance described in Patent Document 4 tends to comprise a large amount of impurities upon production of a precursor thereof so that the operation of the resulting battery tends to be unstable owing to the impurities.

In Patent Document 5, it is described that after a spherical manganese/nickel precursor is obtained by gradually adding dropwise a mixed solution prepared by mixing manganese sulfate, nickel sulfate and ammonia as a complexing agent into a sodium hydroxide solution, the resulting precursor is mixed with an Li compound and the obtained mixture was subjected to substantial calcination step in a temperature range of not lower than 850° C. and then to annealing step to obtain a high-voltage positive electrode active substance. However, in the above method, it is required that the substantial calcination step after being mixed with the Li compound is carried out at a high temperature near 1000° C. so that $Mn^{3+}$ is produced by compensation of valence number owing to oxygen deficiency according to a shape of a charge/discharge curve thereof. In addition, in this production method, sodium and sulfur components remain in a large amount in the respective spherical particles so that the operation of the resulting battery tends to be unstable.

In Patent Document 6, it has been reported that after mixing lithium nitrate, manganese nitrate and nickel nitrate, PVA is added dropwise to the resulting mixture and granulated therewith, and the obtained granulated product is subjected to calcination step at a temperature of at highest 500° C. to obtain a high-capacity positive electrode material. However, since the calcination temperature is low, it may be difficult to increase a crystallinity of the resulting material, and side reactions with an electrolyte solution tend to be readily caused owing the low crystallinity, so that there is a possibility that good long-term characteristics such as cycle characteristics are unattainable.

In Patent Document 7, it has been reported that a mixture of manganese sulfate and nickel sulfate is gradually added dropwise into an aqueous sodium hydroxide solution while controlling a pH value thereof to obtain a manganese/nickel hydroxide whose primary particles have a spherical shape and a small particle diameter without using any complexing agent, and the hydroxide is heat-treated at 900° C. to obtain a nickel/manganese composite oxide having a high tap density in which Ni is uniformly present in the form of a solid solution, and then the thus obtained composite oxide is reacted with an Li compound to thereby obtain a positive electrode active substance. However, since the precursor described in the invention of Patent Document 7 is produced without using any complexing agent, the aggregated secondary particles thereof have a distorted shape (as viewed from SEM image), so that the resulting material has failed to exhibit a sufficient tap density even by heat-treating the precursor at a high temperature.

In Non-Patent Document 1, it is described that the resulting substance has the same crystal structure as described in the present specification. However, in Non-Patent Document 1, there are described neither specific production methods nor specific shapes of the resulting substance.

In Non-Patent Document 2, there are described exothermic and endothermic reactions that are caused by phase transition under low temperature conditions owing to oxygen deficiency of lithium manganate. However, there is not described at all any behavior of the material upon low-temperature conditions in the case where further influences such as oxygen deficiency of nickel-containing lithium manganate and substitution of Ni for the Mn site are added.

In Non-Patent Document 3, it is described that the nickel-containing lithium manganate having a space group of Fd-3m can exhibit good results. The manganese/nickel composite oxide particles according to the present invention can be suitably formed into the nickel-containing lithium manganate particles as the material described in Non-Patent Document 3. Meanwhile, in Non-Patent Document 3, it is neither described nor suggested that the manganese/nickel composite oxide particles as a precursor of the nickel-containing lithium manganate must be well controlled in their characteristics to obtain the aimed nickel-containing lithium manganate.

In consequence, according to the present invention, there are provided positive electrode active substance particles comprising nickel-containing lithium manganate particles which have a high discharge voltage, are excellent in charge/discharge capacities and exhibit good cycle characteristics and a process for producing the positive electrode active substance particles, and a non-aqueous electrolyte secondary battery comprising a positive electrode comprising the positive electrode active substance particles.

In addition, according to the present invention, there are provided excellent positive electrode active substance particles for non-aqueous electrolyte secondary batteries which have a high discharge voltage and a high discharge capacity and hardly suffer from side reactions with an electrolyte solution and a process for producing the positive electrode active substance particles, and a non-aqueous electrolyte secondary battery.

Further, according to the present invention, there are provided manganese/nickel composite oxide particles as a precursor suitable for producing positive electrode active substance particles for non-aqueous electrolyte secondary batteries comprising nickel-containing lithium manganate particles which have a high discharge voltage, are excellent in charge/discharge capacities and exhibit good cycle characteristics and a process for producing the manganese/nickel composite oxide particles, a process for producing the positive electrode active substance particles using the precursor, and a non-aqueous electrolyte secondary battery comprising a positive electrode comprising the positive electrode active substance particles.

Means for Solving the Problem

That is, according to the present invention, there are provided positive electrode active substance particles for non-aqueous electrolyte secondary batteries having a spinel structure with a composition represented by the following chemical formula (1), in which the positive electrode active substance particles satisfy the following characteristic (A) and/or characteristic (B) when indexed with Fd-3m in X-ray diffraction thereof (Invention 1):

(A) when indexed with Fd-3m in X-ray diffraction of the positive electrode active substance particles, a ratio of I(311) to I(111) [I(311)/I(111)] is in the range of 35 to 43%, and/or (B) when indexed with Fd-3m in X-ray diffraction of the positive electrode active substance particles, a gradient of a straight line determined by a least square method in a graph prepared by plotting sine in an abscissa thereof and B cos θ in an ordinate thereof wherein B is a full-width at half maximum with respect to each peak position 2θ (10 to 90°) is in the range of $3.0 \times 10^{-4}$ to $20.0 \times 10^{-4}$; and

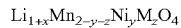    Chemical Formula (1)

wherein x, y, z fall within the range of −0.05·x·0.15, 0.4·y·0.6 and 0·z·0.20, respectively; and M is at least one element selected from the group consisting of Mg, Al, Si, Ca, Ti, Co, Zn, Sb, Ba, W and Bi.

Also, according to the present invention, there are provided the positive electrode active substance particles for non-aqueous electrolyte secondary batteries as described in the above Invention 1, wherein in the characteristic (A) and/or characteristic (B), the positive electrode active substance particles have an average secondary particle diameter (D50) of 4 to 30 μm (Invention 2).

Also, according to the present invention, there are provided the positive electrode active substance particles for non-aqueous electrolyte secondary batteries as described in the above Invention 1 or 2, wherein in the characteristic (A) and/or characteristic (B), the positive electrode active substance particles have a specific surface area of 0.05 to 1.00 m²/g as measured by a BET method (Invention 3).

In addition, according to the present invention, there are provided positive electrode active substance particles for non-aqueous electrolyte secondary batteries having a spinel structure with a composition represented by the following chemical formula (1), in which the positive electrode active substance particles have an average primary particle diameter of 1.0 to 4.0 μm, an average secondary particle diameter (D50) of 4 to 30 μm and a BET specific surface area of 0.3 to 1.0 m²/g, and a product y of the average secondary particle diameter (D50) and the BET specific surface area of the positive electrode active substance particles is in the range of $y \cdot 10.0 \times 10^{-6}$ m³/g (Invention 4):

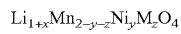    Chemical Formula (1)

wherein x, y, z fall within the range of −0.05·x·0.15, 0.4·y·0.6 and 0·z·0.20, respectively; and M is at least one element selected from the group consisting of Mg, Al, Si, Ca, Ti, Co, Zn, Sb, Ba, W and Bi.

Also, according to the present invention, there are provided the positive electrode active substance particles for non-aqueous electrolyte secondary batteries as described in the above Invention 4, wherein a full-width at half maximum z of a peak of a (400) plane as measured in X-ray diffraction of the positive electrode active substance particles is in the range of z·0.230° (Invention 5).

Also, according to the present invention, there are provided the positive electrode active substance particles for non-aqueous electrolyte secondary batteries as described in any one of the above Inventions 1 to 5, wherein the positive electrode active substance particles have a tap density of not less than 1.7 g/mL (when tapped 500 times) (Invention 6).

Also, according to the present invention, there are provided the positive electrode active substance particles for non-aqueous electrolyte secondary batteries as described in any one of the above Inventions 1 to 6, wherein the positive electrode active substance particles have a sodium content of 30 to 2000 ppm and a sulfur content of 10 to 600 ppm and a total impurity content of not more than 5000 ppm (Invention 7).

Also, according to the present invention, there are provided the positive electrode active substance particles for non-aqueous electrolyte secondary batteries as described in any one of the above Inventions 1 to 7, wherein the positive electrode active substance particles have an endotherm of 0.3 to 0.8 J/mg as measured by differential scanning calorimetry when heated from −40° C. to 70° C. (Invention 8).

Also, according to the present invention, there are provided the positive electrode active substance particles for non-aqueous electrolyte secondary batteries as described in the above Invention 1 or 2, wherein a non-aqueous electrolyte secondary battery produced using the positive electrode active substance particles has a capacity of not less than 130 mAh/g as measured in a voltage range of not less than 3.0 V based on metallic lithium, and a capacity of not less than 120 mAh/g as measured in a voltage range of not less than 4.5 V based on metallic lithium, and a cycle retention rate of not less than 55% as measured after 200 cycles using artificial graphite as a counter electrode (Invention 9).

Also, according to the present invention, there are provided the positive electrode active substance particles for non-aqueous electrolyte secondary batteries as described in the above Invention 1 or 2, wherein a secondary battery produced using the positive electrode active substance particles and Li as a counter electrode has a discharge capacity (3.5 V-3.0 V) of not more than 2 mAh/g as measured after 30 cycles upon subjecting the secondary battery to a cycle test at 25° C. (Invention 10).

Also, according to the present invention, there are provided the positive electrode active substance particles for non-aqueous electrolyte secondary batteries as described in the above Invention 4 or 5, wherein when subjecting a non-aqueous electrolyte secondary battery produced using the positive electrode active substance particles to initial charging, a ratio of (b−a)/b in which a represents a battery capacity when charged up to 4.8 V and b is a battery capacity when charged up to 5.0 V is less than 10% (Invention 11).

Also, according to the present invention, there are provided the positive electrode active substance particles for non-aqueous electrolyte secondary batteries as described in the above Invention 4 or 5, wherein a non-aqueous electrolyte secondary battery produced using the positive electrode active substance particles has an initial charge/discharge efficiency of not less than 90% (Invention 12).

Further, according to the present invention, there is provided a process for producing the positive electrode active substance particles for non-aqueous electrolyte secondary batteries as described in the above Invention 4 or 5, comprising the steps of mixing a composite compound comprising Mn and Ni as main components with an Li compound; subjecting the resulting mixture to calcination step (1) in an oxidative atmosphere at a temperature of 680 to 1050° C.; and successively subjecting the calcined product to calcination step (2) at a temperature of 500 to 700° C. (Invention 13).

Furthermore, according to the present invention, there is provided a non-aqueous electrolyte secondary battery using the positive electrode active substance particles as described in any one of the above Inventions 1 to 12 (Invention 14).

Still furthermore, according to the present invention, there are provided manganese/nickel composite oxide particles comprising Mn and Ni as main components and having a cubic system spinel structure with a space group of Fd-3m, the composite oxide particles being substantially formed of a single phase and having an average primary particle diameter of 1.0 to 8.0 μm (Invention 15).

Also, according to the present invention, there are provided the manganese/nickel composite oxide particles as described in the above Invention 15, wherein the composite oxide particles have a tap density of not less than 1.8 g/mL and a full-width at half maximum of a strongest peak of 0.15 to 0.25 as measured by X-ray diffraction, said composite oxide particles having a composition represented by the following chemical formula (2) (Invention 16):

  Chemical Formula (2):

wherein y and z fall within the range of 0.2·y<0.3 and 0 z·0.10, respectively; and M is at least one element selected from the group consisting of Mg, Al, Si, Ca, Ti, Co, Zn, Sb, Ba, W and Bi.

Also, according to the present invention, there are provided the manganese/nickel composite oxide particles as described in the above Invention 15 or 16, wherein the composite oxide particles have a sodium content of 100 to 2000 ppm, a sulfur content of 10 to 1000 ppm and a total impurity content of not more than 4000 ppm (Invention 17).

In addition, according to the present invention, there is provided a process for producing the manganese/nickel composite oxide particles as described in any one of the above Inventions 15 to 17, comprising the steps of:

conducting a primary reaction in which an aqueous manganese salt solution is neutralized with an excess amount of an aqueous alkali solution based on an equivalent amount of manganese in the aqueous manganese salt solution to obtain a water suspension comprising a hydroxide of manganese, and the resulting water suspension is subjected to oxidation reaction in a temperature range of 60 to 100° C., thereby obtaining trimanganese tetraoxide particles as core particles;

conducting a secondary reaction in which a manganese raw material and a nickel raw material are added to a reaction solution obtained after the primary reaction, and then the resulting mixture is subjected to oxidation reaction, thereby obtaining a manganese/nickel composite compound comprising the trimanganese tetraoxide particles as core particles; and calcining the manganese/nickel composite compound comprising the trimanganese tetraoxide particles as core particles in an oxidative atmosphere in a temperature range of 900 to 1100° C. (Invention 18).

Also, according to the present invention, there is provided the process for producing the manganese/nickel composite oxide particles as described in the above Invention 18, wherein an excess amount of the aqueous alkali solution has an alkali concentration of 0.1 to 5.0 mol/L (Invention 19).

Also, according to the present invention, there is provided the process for producing the manganese/nickel composite oxide particles as described in the above Invention 18 or 19, wherein an atmosphere for the reaction solution obtained after the primary reaction is changed to a non-oxidative atmosphere, and then while maintaining the non-oxidative atmosphere, an aqueous solution of the manganese raw material and an aqueous solution of the nickel raw material are added to the reaction solution to conduct the secondary reaction (Invention 20).

Further, according to the present invention, there is provided a process for producing positive electrode active substance particles for non-aqueous electrolyte secondary batteries having a cubic system spinel structure, comprising the steps of:

mixing the manganese/nickel composite oxide particles as described in any one of the above Inventions 15 to 17 with a lithium compound;

calcining the resulting mixture in an oxidative atmosphere at a temperature of 680 to 1050° C.; and successively calcining the resulting calcined product at a temperature of 500 to 700° C. (Invention 21).

Also, according to the present invention, there is provided the process for producing positive electrode active substance particles for non-aqueous electrolyte secondary batteries as described in the above Invention 21, wherein the positive electrode active substance particles for non-aqueous electrolyte secondary batteries as produced by the process are the positive electrode active substance particles as described in any one of the above Inventions 1 to 12 (Invention 22).

Furthermore, according to the present invention, there is provided a non-aqueous electrolyte secondary battery using the producing positive electrode active substance particles produced by the process for producing positive electrode active substance particles as described in the above Invention 21 or 22 (Invention 23).

Effect of the Invention

The positive electrode active substance particles for non-aqueous electrolyte secondary batteries according to the present invention are capable of providing positive electrode active substance particles for non-aqueous electrolyte secondary batteries which can exhibit a high discharge voltage and a large discharge capacity, hardly suffer from side reactions with an electrolyte solution and are excellent in cycle characteristics.

The manganese/nickel composite oxide particles according to the present invention can be compounded with an Li compound to produce positive electrode active substance particles which can be used to obtain a non-aqueous electrolyte secondary battery capable of exhibiting a high discharge voltage, a large discharge capacity and good cycle characteristics. Therefore, the manganese/nickel composite oxide particles can be suitably used as a precursor of positive electrode active substance particles for non-aqueous electrolyte secondary batteries.

In addition, the positive electrode active substance particles which can be obtained by compounding the manganese/nickel composite oxide particles according to the present invention with an Li compound are capable of providing nickel-containing lithium manganate particles having a space group of Fd-3m which have been reported to have good battery characteristics as described in Non-Patent Document 3, and therefore the manganese/nickel composite oxide particles according to the present invention can be suitably used as a precursor thereof.

BRIEF DESCRIPTION OF THE DRAWINGS

FIG. 1-2 is an X-ray diffraction diagram of positive electrode active substance particles for lithium ion batteries obtained in Comparative Example 1-1.

FIG. 1-3 is an SEM image of positive electrode active substance particles for lithium ion batteries obtained in Example 1-1.

FIG. 1-4 is an SEM image of positive electrode active substance particles for lithium ion batteries obtained in Comparative Example 1-1.

FIG. 2-1 is an X-ray diffraction diagram of positive electrode active substance particles for lithium ion batteries obtained in Example 2-1.

FIG. 2-2 is an X-ray diffraction diagram of positive electrode active substance particles for lithium ion batteries obtained in Comparative Example 2-1.

FIG. 2-3 is an SEM image of positive electrode active substance particles for lithium ion batteries obtained in Example 2-1.

FIG. 2-4 is an SEM image of positive electrode active substance particles for lithium ion batteries obtained in Comparative Example 2-1.

FIG. 3-1 is an X-ray diffraction diagram of positive electrode active substance particles for non-aqueous electrolyte secondary batteries obtained in Example 3-1.

FIG. 3-2 is a charge/discharge characteristic curve of positive electrode active substance particles for non-aqueous electrolyte secondary batteries obtained in Comparative Example 3-1.

FIG. 3-3 is an SEM image of positive electrode active substance particles for non-aqueous electrolyte secondary batteries obtained in Example 3-1.

FIG. 3-4 is an SEM image of positive electrode active substance particles for non-aqueous electrolyte secondary batteries obtained in Comparative Example 3-1.

FIG. 4-1 is an X-ray diffraction diagram of manganese/nickel composite particles obtained in Example 4-1.

FIG. 4-2 is an X-ray diffraction diagram of nickel-containing manganese carbonate particles obtained in Comparative Example 4-1.

FIG. 4-3 is an SEM image of manganese/nickel composite particles obtained in Example 4-1.

FIG. 4-4 is an SEM image of nickel-containing manganese carbonate particles obtained in Comparative Example 4-1.

PREFERRED EMBODIMENTS FOR CARRYING OUT THE INVENTION

Figure 1:
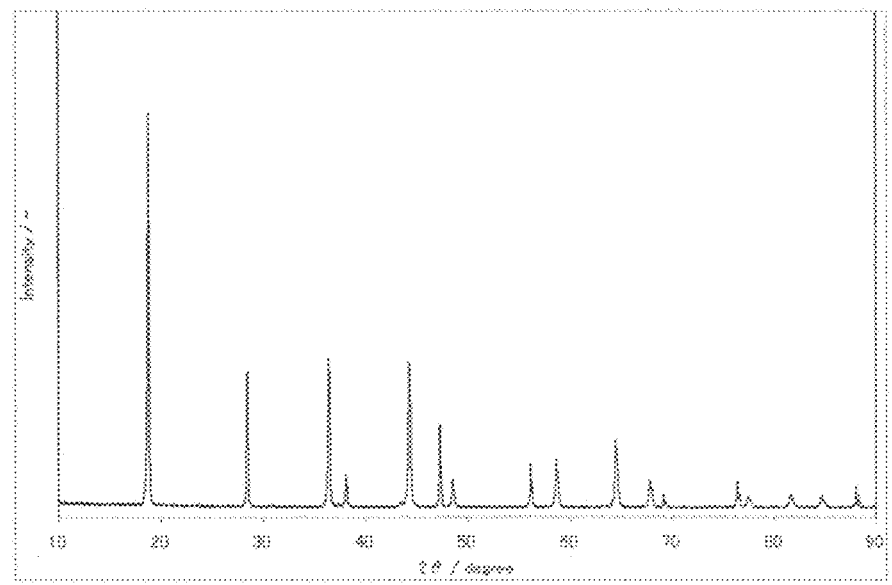
FIG. 1-1 is an X-ray diffraction diagram of positive electrode active substance particles for lithium ion batteries obtained in Example 1-1.

The construction of the present invention is described in more detail below.

First, the manganese/nickel composite oxide particles as a precursor of the positive electrode active substance particles for non-aqueous electrolyte secondary batteries according to the Invention 15 are described.

The manganese/nickel composite oxide particles according to the Invention 15 are those particles optimized as a precursor of the positive electrode active substance particles for non-aqueous electrolyte secondary batteries.

The manganese/nickel composite oxide particles according to the Invention 15 have a cubic system spinel crystal structure with a space group of Fd-3m. When the manganese/nickel composite oxide particles have the other crystal structure as a main component, it may be difficult to produce a positive electrode active substance having a desired crystal structure from the manganese/nickel composite oxide particles.

The manganese/nickel composite oxide particles according to the Invention 15 preferably have a composition represented by the following chemical formula:

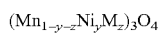

wherein y is in the range of 0.2·y<0.3 and z is in the range of 0·z·0.10. As the M element introduced, there may be mentioned generally known additive elements such as Mg, Al, Si, Ca, Ti, Co, Zn, Y, Zr, Sb, Ba, W and Bi. Among these elements, preferred are Mg, Al, Si, Ti, Co, Zn, Y, Zr, Sb and W. The content of the above additive elements in the resulting manganese/nickel composite oxide particles is preferably not more than 10 mol % based on the manganese/nickel composite oxide.

The manganese/nickel composite oxide particles according to the Invention 15 preferably have an Ni content of 20 to 30 mol % based on a total amount of whole Me components (a total amount of Mn, Ni and substituent metal elements M). When the Ni content is less than 20 mol %, the positive electrode active substance particles obtained by using the precursor tend to have an excessively small discharge plateau region at a voltage of not less than 4.5 V and therefore fail to exhibit a high discharge capacity, resulting in unstable structure thereof. When the Ni content is more than 30 mol %, the positive electrode active substance particles obtained by using the precursor tend to comprise not only the spinel-type structure but also a large amount of impurity phases such as nickel oxide, so that the discharge capacity of the positive electrode active substance particles tends to be lowered. The Ni content of the manganese/nickel composite oxide particles is more preferably 22 to 28 mol % and still more preferably 23 to 27 mol %.

The manganese/nickel composite oxide particles according to the Invention 15 belong to a cubic system manganese/nickel composite oxide when analyzed by X-ray diffraction. For this reason, the manganese/nickel composite oxide particles preferably have such a structure that nickel is uniformly dispersed in trimanganese tetraoxide as a base material. The manganese/nickel composite oxide particles according to the present invention preferably have a full-width at half maximum of the strongest peak ((311) plane) of 0.15 to 0.25 as measured by X-ray diffraction thereof. When the full-width at half maximum of the strongest peak ((311) plane) of the manganese/nickel composite oxide particles is less than 0.15, the impurity phases tend to be present in the particles. When the full-width at half maximum of the strongest peak ((311) plane) of the manganese/nickel composite oxide particles is more than 0.25, it may be difficult to uniformly disperse nickel in the manganese oxide particles. The full-width at half maximum of the strongest peak ((311) plane) of the manganese/nickel composite oxide particles is more preferably in the range of 0.15 to 0.22.

The manganese/nickel composite oxide particles according to the Invention 15 have an average primary particle diameter of 1.0 to 8.0 and are preferably present in the form of secondary particles obtained by aggregating the primary particles. When the average primary particle diameter of the manganese/nickel composite oxide particles is less than 1.0 μm, the battery obtained by using the manganese/nickel composite oxide particles tends to readily suffer from elution of metal components contained therein such as Ni and Mn into an electrolyte solution, so that the crystal structure of the manganese/nickel composite oxide particles tends to become unstable. On the other hand, when the average primary particle diameter of the manganese/nickel composite oxide particles is more than 8.0 μm, the diffusion of Li into the precursor when calcining a mixture of the precursor and an Li compound tends to be insufficient, resulting in unstable structure of the manganese/nickel composite oxide particles. The average primary particle diameter of the manganese/nickel composite oxide particles is preferably in the range of 1.5 to 7.5 μm and more preferably 1.5 to 7.0 μm.

The manganese/nickel composite oxide particles according to the Invention 15 preferably have a tap density of not less than 1.8 g/mL and more preferably not less than 1.9 g/mL (when tapped 500 times).

The manganese/nickel composite oxide particles according to the Invention 15 preferably have an Na content of 100 to 2000 ppm. When the Na content of the manganese/nickel composite oxide particles is less than 100 ppm, the positive electrode active substance particles obtained using the composite oxide particles tend to be deteriorated in capability of retaining a spinel-type structure therein. When the Na content of the manganese/nickel composite oxide particles is more than 2000 ppm, the positive electrode active substance particles obtained using the composite oxide particles tend to have a poor mobility of lithium therein and tend to be deteriorated in discharge capacity. The Na content of the manganese/nickel composite oxide particles is more preferably 100 to 1800 ppm and still more preferably 100 to 1700 ppm.

The manganese/nickel composite oxide particles according to the Invention 15 preferably have an S content of 10 to 1000 ppm. When the S content of the manganese/nickel composite oxide particles is less than 10 ppm, the positive electrode active substance particles obtained using the composite oxide particles tend to be deteriorated in electric effects of S on mobility of lithium. When the S content of the manganese/nickel composite oxide particles is more than 1000 ppm, the battery produced using the positive electrode active substance particles obtained from the composite oxide particles tends to suffer from micro-shorts by local production of $FeSO_4$, etc., owing to formation of a compound of S with Fe derived from the raw materials. The S content of the manganese/nickel composite oxide particles is more preferably 10 to 800 ppm and still more preferably 10 to 700 ppm.

The manganese/nickel composite oxide particles according to the Invention 15 have a total impurity content of not more than 4000 ppm. When the total impurity content of the manganese/nickel composite oxide particles is more than 4000 ppm, the positive electrode active substance particles obtained using the composite oxide particles tend to be considerably deviated in composition of a finally obtained product from that charged, resulting in deterioration in discharge capacity of the resulting battery. The total impurity content of the manganese/nickel composite oxide particles is preferably not more than 3500 ppm and more preferably not more than 3000 ppm.

Next, the process for producing the manganese/nickel composite oxide particles according to the Invention 15 (Invention 18) is described.

That is, the manganese/nickel composite oxide particles according to the Invention 15 can be produced by conducting a primary reaction in which an aqueous manganese salt solution is neutralized with an excess amount of an aqueous alkali solution based on an equivalent amount of manganese in the aqueous manganese salt solution to obtain a water suspension comprising a hydroxide of manganese, and the resulting water suspension is subjected to oxidation reaction in a temperature range of 60 to 100° C., thereby obtaining trimanganese tetraoxide particles a core particles; conducting a secondary reaction in which predetermined amounts of a manganese raw material and a nickel raw material are added, if required together with an aqueous solution in which an M element raw material is dissolved, to a reaction solution obtained after the primary reaction, and then the resulting mixture is subjected to oxidation reaction, followed by washing and drying the resulting product by ordinary methods, thereby obtaining a manganese/nickel composite compound comprising the trimanganese tetraoxide particles as a base material which servers as an intermediate product of the manganese/nickel composite oxide particles according to the present invention; and calcining the manganese/nickel composite compound in an oxidative atmosphere in a temperature range of 900 to 1100° C.

The manganese compound and the nickel compound used upon synthesis of the manganese/nickel composite oxide particles are not particularly limited. Examples of the manganese compound and the nickel compound include various oxides, hydroxides, chlorides, sulfates, nitrates, carbonates and acetates of manganese and nickel. Among these compounds, the sulfates are especially preferably used.

In the primary reaction in which an intermediate product of the manganese/nickel composite oxide particles are obtained in a wet process, an aqueous manganese salt solution is neutralized with an excess amount of an aqueous alkali solution based on an equivalent amount of manganese in the aqueous manganese salt solution to obtain a water suspension comprising a hydroxide of manganese, and the resulting water suspension is subjected to oxidation reaction in a temperature range of 60 to 100° C., thereby obtaining trimanganese tetraoxide core particles. The core particles may be synthesized according to the production method as described in Japanese Patent No. 4305629.

After synthesizing the trimanganese tetraoxide core particles in the primary reaction, the atmosphere for the reaction solution obtained after the primary reaction is changed to a non-oxidative atmosphere. Thereafter, while maintaining the non-oxidative atmosphere, an aqueous solution of the manganese raw material and an aqueous solution of the nickel raw material are added to the reaction solution, if required, together with the M element raw material aqueous solution. Examples of the non-oxidative atmosphere include Ar, CO, CO, $N_2$, $H_2$, etc. Among these non-oxidative atmospheres, preferred is $N_2$.

Also, by adding the aqueous solution of the manganese raw material and the aqueous solution of the nickel raw material, if required, together with the M element raw material aqueous solution, to the reaction solution in the non-oxidative atmosphere, fine particles of a hydroxide or oxyhydroxide of manganese, nickel or M element are produced in addition to trimanganese tetraoxide core particles as a base material in a reaction vessel. Next, when the atmosphere for the reaction solution is changed to an oxidative atmosphere, the hydroxide or oxyhydroxide is converted into an oxide and at the same time subjected to any reaction with the trimanganese tetraoxide core particles, so that a precipitate of the intermediate product can be obtained without deterioration in crystallinity of the core particles.

As the nickel raw material, there may be used oxides, nitrates, sulfates, chlorides, carbonates, acetates or the like of nickel. Among these compounds, the sulfates are preferably used.

As the M element raw material, there may be used oxides, nitrates, sulfates, chlorides, carbonates, acetates or the like of Mg, Al, Si, Ca, Ti, Co, Zn, Sb, Ba, W and Bi. Among these compounds, the sulfates are preferably used.

Also, in the primary and secondary reactions, an excess amount of an aqueous alkali solution is preferably added. The concentration of the aqueous alkali solution is 0.1 to 5.0 mol/mL. When reacting an excess amount of the aqueous alkali solution with the respective raw materials, any acidic substance salt is hardly incorporated into the reaction product obtained after the reaction, so that the content of impurities in the reaction product can be reduced. The concentration of the aqueous alkali solution is preferably 0.5 to 4.0 mol/mL.

The aqueous alkali solution is not particularly limited, and various basic raw materials can be used therein. Examples of the alkali used in the aqueous alkali solution include sodium carbonate, sodium hydroxide, lithium hydroxide, potassium carbonate and potassium hydroxide. Among these alkalis, sodium hydroxide is preferably used.

The slurry comprising the intermediate product obtained after the reactions was treated by ordinary methods to wash and dry the intermediate product. In the washing step in the production process of the present invention, impurity substances such as excessive sodium and sulfur components adhered to the intermediate product can be washed out without any loss of the nickel compound and M element compound precipitated by the secondary reaction.

The thus obtained intermediate product is calcined in an oxidative atmosphere in a temperature range of 900 to 1100° C. to obtain the manganese/nickel composite oxide particles according to the present invention. When the calcining temperature is lower than 900° C., Ni tends to be hardly uniformly incorporated into an Mn oxide, and no manganese/nickel composite oxide having a cubic system spinel structure tends to be obtained. When the calcining temperature is higher than 1100° C., Ni tends to be precipitated in the form of NiO as an impurity. The calcining temperature is preferably 900 to 1000° C., more preferably 900 to 980° C. and still more preferably 900 to 960° C.

The manganese/nickel composite oxide particles obtained after the calcination step may be pulverized to control a particle diameter thereof. At this time, it is required that the pulverization is conducted to such an extent that a secondary particle diameter (D50) of the particles only is controlled and no adverse influence on an average primary particle diameter thereof is caused.

Next, the positive electrode active substance particles for non-aqueous electrolyte secondary batteries according to the Invention 1 are described. The nickel-containing positive electrode active substance particles according to the Invention 1 are those optimized as active substance particles for high-voltage non-aqueous electrolyte secondary batteries.

The positive electrode active substance particles according to the Invention 1 have at least a cubic system spinel structure, and may be indexed with Fd-3m in X-ray diffraction thereof. The positive electrode active substance particles comprise Mn as a main component which cooperates with Ni to form a composite oxide thereof, and are also in the form of a compound comprising Li, Ni and Mn.

The positive electrode active substance particles according to the Invention 1 have a composition represented by the chemical formula:

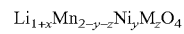

wherein x, y, z fall within the range of −0.05·x·0.15, 0.4·y·0.6 and 0·z·0.20, respectively.

In addition, the positive electrode active substance particles may be substituted with an M element as a different kind of element which is at least one element selected from the group consisting of Mg, Al, Si, Ca, Ti, Co, Zn, Sb, Ba, W and Bi. Among them, preferred additive elements are Mg, Al, Si, Ti, Co, Zn, Y, Zr, Sb and W. The content z of the different kind of M element in the chemical formula of the compound having the spinel-type structure is preferably not more than 0.20. The positive electrode active substance particles according to the Invention 1 can be subjected to charge/discharge cycles without suffering from degradation of the structure even upon charging at a voltage as high as 5 V owing to their spinel-type structure. Further, the positive electrode active substance particles may be accompanied with some oxygen deficiency unless the extent of oxygen deficiency is out of an ordinary allowable range, although the expression concerning such an oxygen deficiency is omitted from the chemical formula.

The positive electrode active substance particles according to the Invention 1 have an Ni content of 20 to 30 mol % based on a total mount of Me components (total amount of Mn, Ni and substituent M elements). When the Ni content is less than 20 mol %, the discharge plateau region at a voltage of not less than 4.5 V in the positive electrode active substance particles tends to become excessively small, so that the resulting positive electrode active substance particles may fail to exhibit a high discharge capacity and also tends to become unstable in structure. Whereas, when the Ni content is more than 30 mol %, a large amount of impurity phases other than the spinel type structure such as nickel oxide tend to be produced in the positive electrode active substance particles, resulting in deterioration in discharge capacity thereof. The Ni content of the positive electrode active substance particles is preferably 22 to 29 mol % and more preferably 23 to 27 mol %.

The molar ratio of Li to a sum of Ni, Mn and M (Li/(Ni+Mn+M)) in the positive electrode active substance particles according to the Invention 1 is 0.475 to 0.575. When the molar ratio (Li/(Ni+Mn+M)) is less than 0.475, an amount of Li contributing to charging tends to be excessively small, resulting in deterioration in charge capacity of the resulting battery. When the molar ratio (Li/(Ni+Mn+M)) is more than 0.575, the amount of Li tends to be contrarily excessively large, the movement of Li ions tends to be inhibited, resulting in deterioration in discharge capacity of the resulting battery. The molar ratio (Li/(Ni+Mn+M)) is preferably 0.48 to 0.55 and more preferably 0.49 to 0.53.

It is required that the positive electrode active substance particles according to the Invention 1 belong to a cubic system spinel structure as analyzed by X-ray diffraction thereof. To meet this requirement, it is further required that Ni is uniformly diffused in the positive electrode active substance particles. If Ni is not uniformly diffused in the particles, a peak (shoulder) of NiO is observed in the X-ray diffraction pattern. When the peak of NiO becomes large, the resulting positive electrode active substance particles tend to become unstable in their structure, resulting in deterioration in battery characteristics.

The positive electrode active substance particles according to the Invention 1 preferably have an average secondary particle diameter (D50) of 4 to 30 μm. When the average secondary particle diameter (D50) is less than 4 μm, the resulting positive electrode active substance particles tend to be increased in contact area with an electrolyte solution and therefore in reactivity with the electrolyte solution, so that the resulting battery tends to be deteriorated in stability upon charging. When the average secondary particle diameter (D50) is more than 30 μm, the resistance within the obtained electrode tends to be increased, so that the resulting battery tends to be deteriorated in charge/discharge rate characteristics. The average secondary particle diameter (D50) of the positive electrode active substance particles is more preferably 4 to 20 μm and still more preferably 4 to 15 μm.

The positive electrode active substance particles according to the Invention 1 preferably have a specific surface area (as measured by a BET method) of 0.05 to 1.00 m$^2$/g. When the specific surface area of the positive electrode active substance particles is excessively small, the obtained positive electrode active substance particles tend to have an excessively small contact area with an electrolyte solution, so that a discharge capacity thereof tends to be lowered. When the specific surface area of the positive electrode active substance particles is excessively large, the obtained positive electrode active substance particles tend to become excessively reactive, so that a discharge capacity thereof also tends to be lowered. The specific surface area of the positive electrode active substance particles is more preferably 0.10 to 0.90 m$^2$/g and still more preferably 0.20 to 0.80 m$^2$/g.

The positive electrode active substance particles according to the Invention 1 preferably have a tap density of not less than 1.70 g/mL (when tapped 500 times). When the tap density of the positive electrode active substance particles is less than 1.70 g/mL, the resulting particles tend to exhibit a poor packing property, resulting in deterioration in battery characteristics, in particular, deterioration in output characteristics and cycle characteristics. The tap density of the positive electrode active substance particles is more preferably not less than 1.80 g/mL and still more preferably not less than 1.85 g/mL.

The positive electrode active substance particles according to the Invention 1 preferably have an Na content of 30 to 2000 ppm. When the Na content of the positive electrode active substance particles is less than 30 ppm, the resulting particles tend to be deteriorated in ability of maintaining a spinel-type structure. When the Na content of the positive electrode active substance particles is more than 2000 ppm, the movement of lithium ions therein tends to be inhibited, so that the resulting battery tend to be deteriorated in discharge capacity. The Na content of the positive electrode active substance particles is more preferably 35 to 1800 ppm and still more preferably 40 to 1700 ppm.

The positive electrode active substance particles according to the Invention 1 preferably have an S content of 10 to 600 ppm. When the S content of the positive electrode active substance particles is less than 10 ppm, no electric effects acting on the movement of lithium tend to be attained. When the S content of the positive electrode active substance particles is more than 600 ppm, the battery obtained using the positive electrode active substance tends to suffer from local precipitation of $FeSO_4$ or the like, resulting in occurrence of micro-shorts therein. The S content of the positive electrode active substance particles is more preferably 15 to 500 ppm.

The positive electrode active substance particles according to the Invention 1 have a total impurity content of not more than 5000 ppm. When the total impurity content of the positive electrode active substance particles is more than 5000 ppm, the deviation of a composition of the resulting particles from a desired composition thereof tends to be increased, so that the obtained positive electrode active substance particles tend to be deteriorated in discharge capacity. The total impurity content of the positive electrode active substance particles is preferably not more than 4000 ppm and more preferably not more than 3500 ppm.

In general, in the case where much oxygen deficiency is present in the positive electrode active substance particles having a nickel/manganese spinel structure, there tends to be observed an endothermic reaction owing to a phase transition between a cubic system and a tetragonal system (or rhombic system) of the spinel structure as measured by differential scanning calorimetry in a low-temperature range. In Non-Patent Document 2, there is described the reaction induced by a phase transition owing to oxygen deficiency of lithium manganate. In the Invention 1, although the plateau attributed to trivalent Mn in a 4 V region as observed in the below-mentioned battery measurement is small, i.e., oxygen deficiency is less, the positive electrode active substance particles according to the Invention 1 undergoes large endothermic and exothermic reactions owing to the phase transition. It is considered that such reactions depend upon the condition of Mn and Ni being present at a 16d site in the spinel structure. Although the reason why the positive electrode active substance particles according to the Invention 1 have a large exotherm is not clearly determined, it has been found that in Invention 1, when the endotherm of the positive electrode active substance particles is in the range of 0.3 to 0.8 J/mg as measured by differential scanning calorimetry when heated from −40° C. to 70° C., the battery obtained using the positive electrode active substance particles can exhibit a sufficient discharge capacity as well as good cycle characteristics.

Although the reason why the positive electrode active substance particles according to the Invention 1 have a large heating value upon the reaction owing to the phase transition in a low-temperature range is not clearly determined, it is considered by the present inventors that not only information as to oxygen deficiency but also information as to the condition of presence of Mn and Ni upon synthesis of the positive electrode active substance particles have been attained.

The positive electrode active substance particles for non-aqueous electrolyte secondary batteries according to the Invention 1 have the following characteristic (A) and/or characteristic (B) when indexed with Fd-3m in X-ray diffraction thereof.

Characteristic (A):

The positive electrode active substance particles according to the Invention 1 have such a structure that when indexed with Fd-3m in X-ray diffraction, a ratio of a peak intensity 1(311) to a peak intensity 1(111) [I(311)/I(111)] is in the range of 35 to 43%. When the peak intensity ratio [I(311)/I(111)] falls within the above-specified range, the positive electrode active substance particles can exhibit a high discharge capacity and good cycle characteristics. The peak intensity ratio [I(311)/I(111)] of the positive electrode active substance particles is preferably in the range of 36 to 42%. When the peak intensity ratio [I(311)/I(111)] is less than 35%, it is not possible to maintain a spinel structure itself of the positive electrode active substance particles. When the peak intensity ratio [I(311)/I(111)] is more than 43%, the positive electrode active substance particles tend to fail to exhibit sufficient discharge capacity and cycle characteristics.

As a result of simulation by Rietveld analysis, it has been found that the ratio between the peak intensity of (311) plane and the peak intensity of (111) plane of the positive electrode active substance particles has a correlation with an amount of substitution of a transition metal, etc., for Li occupying a 8a site of a spinel structure of the positive electrode active substance. The large peak intensity ratio results in an increased amount of Ni being present in the form of a solid solution at the 8a site in the positive electrode active substance particles.

In the case where Ni is present in the form of a solid solution at the 8a site, it is considered that expansion/contraction of Ni owing to the change in its valence between a divalent state and a tetravalent state causes expansion/contraction of a tetrahedral structure at the 8a site. As a result, the cubic system structure of the positive electrode active substance particles tends to be deteriorated in stability, so that the resulting battery tends to be deteriorated in cycle characteristics.

The Ni being present at the 8a site which undergoes the above expansion/contraction acts as a resistance to diffusion of Li ions from the 8a site through a 16c site to an interface of the structure (i.e., diffused into an electrolyte solution). As a result, since it is not possible to allow the Li ions to return to the 8a site, it is considered that the resulting battery tends to be deteriorated in capacity and therefore in cycle characteristics.

Characteristic (B):

The positive electrode active substance particles according to the Invention 1 have such a structure that when indexed with Fd-3m in X-ray diffraction thereof, a gradient of a straight line determined by a least square method in a graph prepared by plotting sin θ in an abscissa thereof and B cos θ in an ordinate thereof wherein B is a full-width at half maximum with respect to each peak position 2θ (10 to) 90° is in the range of $3.0 \times 10^{-4}$ to $20.0 \times 10^{-4}$. According to the Invention 1, it is confirmed that when the gradient of a straight line determined by a least square method in the above-defined graph is controlled to the above-specified range, the resulting battery has a high discharge capacity and good cycle characteristics. The gradient of a straight line determined by a least square method in the above-defined graph is preferably in the range of $3.5 \times 10^{-4}$ to $15.0 \times 10^{-4}$. When the gradient of a straight line determined by a least square method in the above-defined graph is out of the above-specified range, the positive electrode active substance particles may fail to maintain a stable crystal structure and tends to be deteriorated in cycle characteristics.

The graph described in the Invention 1 is called a Williamson-hall plot represented by the following equation.

$$B \cos \theta = \eta \sin \theta + \lambda/D$$

wherein η is a gradient parameter in the Invention 1; λ is a wavelength of X-ray; and D is a crystallite diameter.

Meanwhile, the gradient is generally considered to be a parameter including information such as distortion of a composition or distortion of crystals. Although the details are not clearly determined, in the case where the gradient according to the Invention 1 lies within the above-specified range, it has been found that the positive electrode active substance particles can exhibit a large discharge capacity and excellent cycle characteristics.

Next, the positive electrode active substance particles for non-aqueous electrolyte secondary batteries according to the Invention 4 are described.

The positive electrode active substance particles for non-aqueous electrolyte secondary batteries (hereinafter referred to merely as "positive electrode active substance particles") according to the Invention 4 have at least a cubic system spinel structure. The positive electrode active substance particles comprise Mn and Ni as main components which cooperates to form a composite oxide thereof, and are in the form of a compound comprising Li, Ni and Mn.

The positive electrode active substance particles according to the Invention 4 have an average primary particle diameter of 1.0 to 4.0 μm, an average secondary particle diameter (D50) of 4.0 to 30 μm, a BET specific surface area of 0.3 to 1.0 m²/g and a product y of the average secondary particle diameter (D50) and the BET specific surface area of not more than $10.0 \times 10^{-6}$ m³/g (y·$10.0 \times 10^{-6}$ m³/g).

When the average primary particle diameter of the positive electrode active substance particles according to the Invention 4 is out of the above-specified range, the positive electrode active substance particles tend to be enhanced in reactivity with an electrolyte solution and therefore tend to be unstable.

In addition, when the average secondary particle diameter (D50) of the positive electrode active substance particles according to the Invention 4 is less than 4.0 μm, the positive electrode active substance particles tend to have an excessively large contact area with an electrolyte solution and therefore tend to be enhanced in reactivity with the electrolyte solution, so that the resulting battery tends to be deteriorated in stability upon charging. When the average secondary particle diameter (D50) of the positive electrode active substance particles according to the Invention 4 is more than 30 μm, the resistance in the resulting electrode tends to be increased, so that the charge/discharge rate characteristics of the resulting battery tend to be deteriorated. The average secondary particle diameter (D50) of the positive electrode active substance particles according to the Invention 4 is preferably 4.0 to 20 μm and more preferably 5.0 to 15 μm.

The positive electrode active substance particles according to the Invention 4 preferably have a specific surface area (as measured by a BET specific surface area method) of 0.3 to 1.00 m$^2$/g. When the specific surface area is excessively small, the positive electrode active substance particles tend to have an excessively small contact area with an electrolyte solution and therefore tend to be deteriorated in discharge capacity. When the specific surface area is excessively large, the positive electrode active substance particles tend to be reacted with an electrolyte solution and therefore tend to suffer from generation of gases and tend be deteriorated in initial efficiency. The BET specific surface area of the positive electrode active substance particles according to the Invention 4 is more preferably 0.35 to 0.80 m$^2$/g and still more preferably 0.43 to 0.75 m$^2$/g.

The positive electrode active substance particles according to the Invention 4 have a product y of an average secondary particle diameter (D50) and a BET specific surface area of not more than 10.0×10$^{-6}$ m$^3$/g. When the product y of the positive electrode active substance particles is more than 10.0×10$^{-6}$ m$^3$/g, the secondary particles thereof tend to exhibit surface conditions having many irregularities thereon so that the secondary battery obtained using the positive electrode active substance particles tends to be reacted with an electrolyte solution and therefore suffer from generation of gases and deterioration in battery properties. The product y of an average secondary particle diameter (D50) and a BET specific surface area of the positive electrode active substance particles is preferably not more than 9.5×10$^{-6}$ m$^3$/g, more preferably 1.0×10$^{-6}$ to 9.0×10$^{-6}$ m$^3$/g and still more preferably 2.0×10$^{-6}$ to 8.8×10$^{-6}$ m$^3$/g.

The product y of an average secondary particle diameter (D50) and a BET specific surface area of the positive electrode active substance particles has a unit of m$^3$/g (inverse number of density) and therefore is considered to represent a volume of the secondary particles per a unit weight. In other words, a minimum surface area of the particles is determined from the diameter (secondary particle diameter) and the shape. In general, the particles have a surface area not smaller than that determined by the product value y, and the product value y is regarded as a parameter due to the surface condition of the particles. As a result, the number of the value y is considered to be a parameter indicating surface properties of the particles. The large number of the value y is considered to show such a condition that many irregularities are present on the surface of the particles, whereas the small number of the value y is considered to show such a condition that less irregularities are present on the surface of the particles and therefore the surface condition of the particles is close to a smooth condition. When the value y lies within the above-specified range according to the present invention, it is considered that the surface properties of the particles become good so that side reactions between the particles and an electrolyte solution can be reduced.

The full-width at half maximum z of a peak of (400) plane of the positive electrode active substance particles according to the Invention 4 as measured by X-ray diffraction (FWMH (400)) is preferably in the range of z·0.230°. When the full-width at half maximum z of a peak of (400) plane of the positive electrode active substance particles is more than 0.230°, the positive electrode active substance particles tend to be in the form of unstable crystals, and therefore the resulting battery tends to be deteriorated in battery characteristics. The full-width at half maximum z of a peak of (400) plane of the positive electrode active substance particles is more preferably in the range of z·0.220° and still more preferably 0.044° ·z<0.180°.

The full-width at half maximum of a peak of (111) plane of the positive electrode active substance particles according to the Invention 4 as measured by X-ray diffraction is preferably not more than 0.15° and more preferably 0.053° to 0.12°. The full-width at half maximum of a peak of (311) plane of the positive electrode active substance particles according to the Invention 4 as measured by X-ray diffraction is preferably not more than 0.18° and more preferably 0.044° to 0.14°. The full-width at half maximum of a peak of (440) plane of the positive electrode active substance particles according to the Invention 4 as measured by X-ray diffraction is preferably not more than 0.25° and more preferably 0.045° to 0.20°.

The positive electrode active substance particles according to the Invention 4 have a composition represented by the chemical formula:

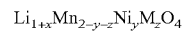

$$Li_{1+x}Mn_{2-y-z}Ni_yM_zO_4$$

wherein x, y, z fall within the range of −0.05·x·0.15, 0.4·y·0.6 and 0·z·0.20, respectively.

In addition, the positive electrode active substance particles may be substituted with a different kind of M element which is at least one element selected from the group consisting of Mg, Al, Si, Ca, Ti, Co, Zn, Sb, Ba, W and Bi. Among them, preferred additive elements are Mg, Al, Si, Ti, Co, Zn, Y, Zr, Sb and W. The content z of the different kind of M element in the chemical formula of the compound having the spinel-type structure is preferably not more than 0.20. The positive electrode active substance particles according to the present invention can be subjected to charge/discharge cycles without suffering from degradation of the structure even upon being subjected to charging at a voltage as high as 5 V owing to their spinel-type structure. Further, the positive electrode active substance particles may be accompanied with some oxygen deficiency unless the extent of oxygen deficiency is out of an ordinary allowable range (although the expression concerning such an oxygen deficiency is omitted from the chemical formula).

Next, the process for producing the positive electrode active substance particles according to the Invention 1 and the Invention 4 as well as the process for producing the positive electrode active substance particles according to the Invention 21 are described.

That is, the positive electrode active substance particles according to the Invention 1 and the Invention 4 are produced using a composite oxide of manganese and nickel as main components having a cubic system spinel structure as a precursor, and preferably produced using the manganese/nickel composite oxide particles according to the Invention 15. In this case, the positive electrode active substance particles for non-aqueous electrolyte secondary batteries according to the Invention 1 and the Invention 4 are the positive electrode active substance particles produced according to the process for producing the positive electrode active substance particles for non-aqueous electrolyte secondary batteries according to the Invention 21.

The positive electrode active substance particles according to the Invention 21 are produced using the manganese/nickel composite oxide particles according to the Invention 15 as a precursor. The positive electrode active substance particles produced using the manganese/nickel composite oxide particles according to the Invention 15 as a precursor are nickel-containing lithium manganate particles comprising at least Li, Ni and Mn and having a spinel type structure, and suitable as positive electrode active substance particles for non-aqueous electrolyte secondary batteries. The nickel-containing positive electrode active substance particles have a high crystallinity, and therefore can exhibit a high discharge capacity and can be stably subjected to charge/discharge cycles without suffering from degradation of the structure even upon being subjected to charging at a voltage as high as 5 V.

The above positive electrode active substance particles can be produced by mixing the precursor and a lithium compound at a predetermined mixing molar ratio and then subjecting the resulting mixture to calcination step (1) in an oxidative atmosphere at a temperature of 680 to 1050° C., and successively subjecting the calcined product to calcination step (2) at a temperature of 500 to 700° C.

The manganese/nickel composite oxide used as a precursor in the Inventions 1 and 4 is in the form of a hydroxide, an oxide, an organic compound or the like and preferably are in the form of an composite oxide of Mn and Ni having a cubic system spinel structure. The above composite oxide has a spinel structure belonging to a space group of Fd-3m and is in the form of an oxide in which manganese and nickel as main components are uniformly distributed at 8a site and/or 16d site thereof. The above precursor may also be in the form of a composite oxide obtained by introducing elements other than manganese and nickel into the above composite oxide.

The manganese/nickel composite oxide used as a precursor in the Inventions 1 and 4 is in the form of a composite oxide comprising Mn and Ni as main components and constituted of substantially a single phase.

The manganese/nickel composite oxide used as a precursor in the Inventions 1 and 4 has an average primary particle diameter of 1.0 to 8.0 μm and preferably 1.0 to 4.0 μm, and preferably has a tap density of not less than 1.8 g/mL and a full-width at half maximum of the strongest peak as measured by X-ray diffraction of 0.15 to 0.25.

In addition, the manganese/nickel composite oxide used as a precursor in the Inventions 1 and 4 has a composition represented by the chemical formula (2).

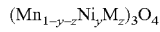

$(Mn_{1-y-z}Ni_yM_z)_3O_4$    Chemical Formula (2):

wherein y and z fall within the range of 0.2·y·0.3 and 0z·0.10, respectively; and M is at least one element selected from the group consisting of Mg, Al, Si, Ca, Ti, Co, Zn, Sb, Ba, W and Bi.

The manganese/nickel composite oxide used as a precursor in the Inventions 1 and 4 preferably has a sodium content of 100 to 2000 ppm, a sulfur content of 10 to 1000 ppm and a total impurity content of not more than 4000 ppm.

The process for producing the manganese/nickel composite oxide particles used in the Inventions 1 and 4 is not particularly limited as long as the above manganese/nickel composite oxide particles capable of satisfying the above characteristics can be produced, and there may be used any production processes such as a solid state reaction process in which various raw materials are mixed and then subjected to calcination, a wet reaction process in which various raw materials are subjected to co-precipitation in an aqueous solution thereof and then subjected to calcination, and the like. For example, the manganese/nickel composite oxide particles may be produced by the following process.

More specifically, the manganese/nickel composite oxide particles used in the Inventions 1 and 4 may be produced by the process comprising the steps of:

conducting a primary reaction in which an aqueous manganese salt solution is neutralized with an excess amount of an aqueous alkali solution based on an equivalent amount of manganese in the aqueous manganese salt solution to obtain a water suspension comprising a hydroxide of manganese, and the resulting water suspension is subjected to oxidation reaction in a temperature range of 60 to 100° C., thereby obtaining trimanganese tetraoxide particles as core particles;

conducting a secondary reaction as a wet reaction step in which predetermined amounts of a manganese raw material and a nickel raw material are added, if required together with an aqueous solution in which an M element raw material is dissolved, to a reaction solution obtained after the primary reaction, and then the resulting mixture is subjected to oxidation reaction, thereby obtaining a manganese/nickel composite compound comprising the trimanganese tetraoxide particles as a base material; and washing and drying the manganese/nickel composite compound obtained after the wet reaction step and then calcining the compound in an oxidative atmosphere in a temperature range of 900 to 1100° C.

The lithium compound used in the present invention is not particularly limited, and various lithium salts may be used in the present invention. Examples of the lithium compound include lithium hydroxide monohydrate, lithium nitrate, lithium carbonate, lithium acetate, lithium bromide, lithium chloride, lithium citrate, lithium fluoride, lithium iodide, lithium lactate, lithium oxalate, lithium phosphate, lithium pyruvate, lithium sulfate and lithium oxide. Among these lithium compounds, preferred is lithium carbonate.

The lithium compound used in the present invention preferably has an average particle diameter of not more than 50 μm and more preferably not more than 30 μm. When the average particle diameter of the lithium compound is more than 50 μm, the lithium compound tends to be hardly uniformly mixed with the precursor particles, so that it may be difficult to obtain composite oxide particles having a good crystallinity.

Also, upon synthesis of the positive electrode active substance particles according to the present invention, a nitrate, an oxide, a hydroxide, a carbonate, etc., of Mg, Al, Si, Ca, Ti, Co, Zn, Sb, Ba, W and Bi may be mixed together with the precursor particles and the lithium compound to introduce these additive elements into the positive electrode active substance particles.

The mixing treatment of the manganese/nickel composite oxide particles and the lithium compound may be conducted by either a dry method or a wet method as long as the they may be uniformly mixed with each other.

In the calcination step of the process according to the present invention, the calcination step (1) is preferably conducted in an oxidative atmosphere at a temperature of 680 to 1050° C. In the calcination step (1), the manganese/nickel composite oxide and the Li compound are reacted with each other to thereby obtain nickel-containing lithium manganate having an oxygen deficiency condition. When the calcination temperature is lower than 680° C., the reactivity between the precursor and Li tends to become poor, thereby failing to obtain a sufficient composite oxide thereof. When the calcination temperature is higher than 1050° C., the sintering tends to proceed excessively, or Ni tends to be released from the crystal lattice and precipitated in the form of an Ni oxide. The calcination temperature is preferably 700 to 1000° C. and more preferably 730 to 950° C., and the calcination time is preferably 2 to 50 hr.

Then, subsequent to the calcination step (1), the heat treatment as the calcination step (2) is conducted in the same oxidative atmosphere at a temperature of 500 to 700° C. The calcination step (2) serves for compensating the oxygen deficiency to obtain nickel-containing positive electrode active substance particles having a stable crystal structure.

The positive electrode active substance particles obtained by the production process according to the Invention 21 are in the form of nickel-containing lithium manganate particles having a spinel-type structure similarly to the positive electrode active substance particles according to the Inventions 1 and 4, and have a composition represented by the chemical formula:

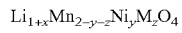

$$Li_{1+x}Mn_{2-y-z}Ni_yM_zO_4$$

wherein x, y, z preferably fall within the range of −0.05·x·0.15, 0.4·y·0.6 and 0·z·0.20, respectively. In addition, Mn in the positive electrode active substance particles may be substituted with an M element which is at least one element selected from the group consisting of Mg, Al, Si, Ca, Ti, Co, Zn, Sb, Ba, W and Bi. Among these additive elements, preferred are Mg, Al, Si, Ti, Co, Zn, Y, Zr, Sb and W. Further, the positive electrode active substance particles may exhibit some oxygen deficiency or oxygen surplus as long as they are within known acceptable ranges.

The positive electrode active substance particles according to the present invention preferably have an average secondary particle diameter (D50) of 4 to 30 μm, a specific surface area as measured by a BET method of 0.05 to 1.00 m²/g and a tap density of not less than 1.7 g/mL (when tapped 500 times).

The positive electrode active substance particles according to the present invention preferably have a sodium content of 30 to 2000 ppm, a sulfur content of 10 to 600 ppm and a total impurity content of not more than 5000 ppm.

Next, the positive electrode comprising the positive electrode active substance particles according to the Inventions 1 and 4 or the positive electrode active substance particles obtained by the production process according to the Invention 21 is described.

When producing the positive electrode comprising the positive electrode active substance particles according to the Inventions 1 and 4 or the positive electrode active substance particles obtained by the production process according to the Invention 21, a conducting agent and a binder are added to and mixed with the positive electrode active substance particles by an ordinary method. Examples of the preferred conducting agent include acetylene black, carbon black and graphite. Examples of the preferred binder include polytetrafluoroethylene and polyvinylidene fluoride.

The secondary battery produced by using the positive electrode comprising the positive electrode active substance particles according to the Inventions 1 and 4 or the positive electrode active substance particles obtained by the production process according to the Invention 21 comprises the above positive electrode, a negative electrode and an electrolyte.

Examples of a negative electrode active substance which may be used for production of the negative electrode include metallic lithium, lithium/aluminum alloys, lithium/tin alloys, and graphite or black lead.

Also, as a solvent for the electrolyte solution, there may be used combination of ethylene carbonate and diethyl carbonate, as well as an organic solvent comprising at least one compound selected from the group consisting of carbonates such as propylene carbonate and dimethyl carbonate, and ethers such as dimethoxyethane.

Further, as the electrolyte, there may be used a solution prepared by dissolving lithium phosphate hexafluoride as well as at least one lithium salt selected from the group consisting of lithium perchlorate and lithium borate tetrafluoride in the above solvent.

The non-aqueous electrolyte secondary battery produced by using the positive electrode comprising the positive electrode active substance particles according to the Invention 1 or the positive electrode active substance particles obtained by the production process according to the Invention 21 has a capacity of not less than 130 mAh/g and preferably not less than 135 mAh/g as measured at a voltage of not less than 3.0 V by the below-mentioned evaluation method, a capacity of not less than 120 mAh/g and preferably not less than 125 mAh/g as measured at a voltage of not less than 4.5 V by the below-mentioned evaluation method, and a cycle retention rate of not less than 55% and preferably not less than 60%. In addition, the non-aqueous electrolyte secondary battery has a rate retention rate of not less than 80% as a ratio of 10 C/0.1 C.

According to the present invention, it is considered that the positive electrode active substance particles having the crystal structure in which an amount of Ni substituted for the 8a site is small (Ni is preferentially diffused in the 16d site) are less influenced by expansion/contraction of their crystal lattice owing to the change in valence of Ni when subjected to charge/discharge cycles, so that a bulk resistance against diffusion of Li ions becomes small when Li ions are diffused into an electrolyte solution through a diffusion path of the Li ions extending from the 8a site to the 16d site. As a result, it is considered that the resulting battery is excellent in rate retention rate and cycle retention rate while maintaining a high discharge capacity.

In addition, when the battery produced by using the positive electrode active substance particles according to the Invention 1 or the positive electrode active substance particles obtained by the production process according to the Invention 21 in which metallic Li is used as a counter electrode is subjected to a cycle test at 25° C., the battery capacity upon discharging (3.5 V to 3.0 V) after subjected to 30 cycles is not more than 2 mAh/g. When the batter capacity is more than 2 mAh/g, the crystals of the positive electrode active substance tend to be unstable so that the resulting battery tends to suffer from early deterioration. The battery capacity is preferably not more than 1.5 mAh/g.

In general, in the battery produced using the positive electrode active substance particles comprising at least Ni and Mn and having a spinel structure, a plateau tends to be frequently observed near 4 V in the discharge curve owing to the change in valence of Mn between a trivalent state and a tetravalent state thereof. This is because Ni deficiency or oxygen deficiency occurs in the crystal lattice. More specifically, it is considered that the above plateau occurs by the change in valence of a part of Mn from a tetravalent state to a trivalent state in order to attain a well-balanced condition of valences in crystals of the positive electrode active substance. It is considered that in order to ensure a good stability of various battery characteristics of the positive electrode active substance, it is important that the plateau near 4 V in the discharge capacity thereof is small.

In the Invention 1, as the index for determining a structural stability of the positive electrode active substance particles, there has been noticed the plateau near 3.3 V in the discharge curve of the last charge/discharge cycle in a 30 cycle test. It has been found that when subjecting the battery produced using the positive electrode active substance particles having poor cycle characteristics to 30 charge/discharge cycles, not only the plateau near 4.0 V but also the plateau near 3.3 V are remarkably increased.

The positive electrode active substance particles obtained by the production process according to the Invention 21 have a high crystallinity as a property derived from the precursor. Thus, according to the process for producing the positive electrode active substance particles, the resulting positive electrode active substance particles have a high crystallinity in a spinel structure thereof. As a result, it is considered that the 16d site of the spinel structure coordinated with Mn, Ni and the M element is susceptible to less expansion/contraction when subjected to charge/discharge cycles, and therefore the resistance against diffusion of Li ions moving to an interface from the 8a site through the 16d site is reduced. As a result, since release of Ni from the structure in the form of NiO and oxygen deficiency are lessened, the capacity in the range of 3.0 V to 4.5 V in which the plateau owing to $Mn^{3+}/Mn^{4+}$ tends to be observed is reduced, so that the resulting battery can be improved in cycle characteristics.

The non-aqueous electrolyte secondary battery produced using a positive electrode comprising the positive electrode active substance particles according to the Invention 4 has a discharge capacity at a voltage of not less than 3.0 V of not less than 130 mAh/g and preferably not less than 135 mAh/g as evaluated by the below-mentioned method.

In addition, in the non-aqueous electrolyte secondary battery produced using a positive electrode comprising the positive electrode active substance particles according to the Invention 4, the ratio of (b−a)/b wherein a is a charge capacity at 4.8 V and b is a charge capacity at 5.0 V when subjected to initial charging using metallic lithium as a counter electrode is less than 10%.

In general, when the battery is subjected to charging of not less than 4.5 V, decomposition of an electrolyte solution tends to be caused, so that upon charging of not less than 4.8 V, the apparent charge capacity due to the decomposition reaction tends to be added to actual charge capacity. As a result of the present inventors' earnest study, it has been found that when the surface properties of the positive electrode active substance particles are optimized, the electrolyte solution suffers from less decomposition so that the apparent charge capacity due to the decomposition of the electrolyte solution is reduced. It is considered that when using the positive electrode active substance particles according to the present invention, it is possible to suppress decomposition of the electrolyte solution and thereby reduce the ratio of (b−a)/b to less than 10%.

When subjecting the secondary battery assembled using a positive electrode comprising the positive electrode active substance particles according to the Invention 4 and metallic lithium as a counter electrode to a charge/discharge cycle test at a cut-off voltage of 3.0 to 5.0 V, the initial charge/discharge efficiency thereof is not less than 90%. As described above, it is considered that since the decomposition of the electrolyte solution is reduced, the apparent charge capacity generated as an excess charge capacity becomes small so that the resulting battery can be improved in charge/discharge efficiency.

In the secondary battery produced using the positive electrode active substance particles according to the Invention 4, occurrence of the decomposition reaction of the electrolyte solution owing to the positive electrode active substance can be suppressed. Therefore, it is considered that, for example, deterioration of the electrolyte solution, generation of gases owing to decomposition of the electrolyte solution or deterioration of the positive electrode itself can be suppressed. As a result, it is considered that the secondary battery produced using the positive electrode active substance particles according to the present invention is excellent in long-term stability.

<Function>

In the case where the positive electrode active substance particles according to the Invention 1 have the characteristic (A) when indexed with Fd-3m in X-ray diffraction thereof, the ratio between the peak intensity of (311) plane and the peak intensity of (111) plane in the X-ray diffraction falls within the range of 35 to 43%, so that it is considered that the resulting battery can exhibit a high discharge capacity and good cycle characteristics.

As a result of simulation by Rietveld analysis of the positive electrode active substance particles, it has been confirmed that when the ratio between the peak intensity of (311) plane and the peak intensity of (111) plane is small, an amount of Ni substituted for a 8a site of the positive electrode active substance particles in which Li is generally present is reduced. As a result, in the present invention, it has been confirmed that Ni is present in a large amount at a 16d site of the particles in which Mn is mainly present. In consequence, it is suggested that only Li that can contribute to charging/discharging of the resulting battery is present at most of the 8a sites, so that the battery has a large discharge capacity and therefore can exhibit good rate characteristics owing to stabilization of crystals of the positive electrode active substance particles.

In the case where the positive electrode active substance particles according to Invention 1 have the characteristic (B) when indexed with Fd-3m in X-ray diffraction thereof, the gradient of a straight line determined by a least square method in a graph prepared by plotting sin θ in an abscissa thereof and B cos θ in an ordinate thereof wherein B is a full-width at half maximum with respect to each peak position 2θ (10 to 90°) is in the range of $3.0 \times 10^{-4}$ to $20.0 \times 10^{-4}$. Thus, it has been confirmed that when the above condition is satisfied, the resulting battery can exhibit a high discharge capacity and good cycle characteristics.

Although the correlation between the gradient determined by a least square method of Williamson-hall plot according to the Invention 1 and the characteristics of the battery produced using the positive electrode active substance particles is not clearly determined, it is suggested that when the gradient falls within the range defined in the present invention, any of parameters of the positive electrode active substance particles such as crystallinity and composition thereof are optimized. As a result of the optimization, it is considered that the positive electrode active substance particles can provide a material having a large discharge capacity and excellent cycle characteristics.

In addition, according to the Invention 1, since Ni is present at the 16d site, it is considered that expansion/contraction of Ni owing to the change in valence of Ni between a divalent state and a tetravalent state thereof upon repeated charge/discharge cycles is mainly relaxed by combination with tetravalent Mn. As a result, since expansion/contraction of the crystal lattice as a whole upon the charge/discharge cycles is reduced, the ion diffusion resistance upon insertion/release of Li is reduced so that the resulting battery can exhibit good cycle characteristics.

Also, it is considered that in the Invention 1, when the endotherm of the positive electrode active substance particles is in the range of 0.3 to 0.8 J/mg as measured by differential scanning calorimetry when heated from −40° C. to 70° C., the battery obtained using the positive electrode active substance particles can exhibit a high discharge capacity as well as good cycle characteristics.

In Non-Patent Document 2, it is described that lithium manganate having the same spinel structure as that of the positive electrode active substance causes phase transition from a cubic system to a tetragonal system. It is not conventionally known that the positive electrode active substance of the present invention in which a large amount of Ni is substituted for Mn sites thereof undergoes generation/absorption of heat by the phase transition. However, at least according to the study of the present invention, the results having a specific difference by the phase transition have been found.

In Non-Patent Document 2, it is described that the phase transition can be achieved by reducing thermal motion of trivalent Mn as a Jahn-Teller ion. However, in the positive electrode active substance, Mn is basically present in the form of a tetravalent ion, and the trivalent Mn is produced when the oxygen deficiency becomes large. As a result, it is considered that the capacity in a 4 V region (trivalent/tetravalent reaction of Mn) is increased as measured in a discharge curve in the battery characteristics. However, according to the evaluation conducted in the present invention, it is considered that the results including not only the behavior of trivalent Mn owing to oxygen deficiency but also parameters such as balance of crystals can be attained. Therefore, in the scope of the Invention 1, it is considered that the resulting battery can exhibit a high discharge capacity and good cycle characteristics.

The manganese/nickel composite oxide particles according to the Invention 15 are characterized by a cubic system spinel structure and a high crystallinity. In the present invention, after previously producing trimanganese tetraoxide core particles (seed particles) having a high crystallinity, a manganese raw material solution and a nickel raw material solution together with an M element raw material solution are charged into a reaction solution comprising a residual amount of the excess alkali components under a nitrogen flow to thereby produce fine particles of hydroxides of the above additive metals. As a result, it is considered that when changing the atmosphere for the reaction solution to an oxidative atmosphere to initiate the oxidation reaction, the hydroxides are precipitated on an interface of the trimanganese tetraoxide particles as core particles. Upon the precipitation, since the resulting precipitate is in the form of an oxide produced from fine particles of the hydroxides of Mn, Ni and M element which are uniformly entangled with each other, no additional particles are locally produced in the reaction solution, and the substituent elements such as Ni can be disposed in the vicinity of an interface of the trimanganese tetraoxide particles as core particles.

In addition, in the Invention 15, by various changing the conditions of the primary reaction, it is possible to control an average primary particle diameter of the particles obtained after the secondary reaction, so that the average primary particle diameter of the manganese/nickel composite oxide particles according to the present invention can be freely designed. In addition, since the manganese/nickel composite oxide particles according to the present invention is synthesized by a wet simple method, it is possible to reduce Na components and S components as impurities by controlling a pH value thereof and further remove impurities contained in the raw materials by a water-washing step.

Next, the intermediate product obtained after the above reaction is washed with water to remove sodium sulfate (mirabilite) as an impurity therefrom, and subjected to calcination at a temperature of 900 to 1100° C. to thereby uniformly disperse a nickel oxide and an oxide of the M element in the form of a solid solution in the trimanganese tetraoxide as core particles. Further, it is considered that owing to the high calcination temperature, it is possible to attain the effects such as smooth surface conditions of the primary particles, formation of strong secondary particles and enhancement in crystallinity of the resulting particles.

When the manganese/nickel composite oxide particles according to the Invention 15 are subjected to calcination step, the nickel oxide and an oxide of the M element optionally added can be distributed therein in the form of a uniform solid solution, thereby obtaining a composite oxide having a cubic system spinel structure.

The manganese/nickel composite oxide particles according to the Invention 15 have a high crystallinity, and can be subjected to calcination at a temperature equal to or lower than the calcination temperature used for obtaining the manganese/nickel composite oxide after mixed with the Li compound. Therefore, it is considered that the properties of particles obtained due to a high crystallinity of the manganese/nickel composite oxide particles as a precursor can be taken over, and it is possible to obtain the positive electrode active substance particles formed of the nickel-containing lithium manganate having a spinel structure with a strong crystal skeleton.

In addition, upon production of the positive electrode active substance particles formed of the nickel-containing lithium manganate, the calcination is conducted at a temperature of about 900° C. so that it is possible to suppress increase in oxygen deficiency and precipitation of NiO composite oxide. For this reason, it is considered that generation of Mn' can be suppressed and therefore cycle characteristics can be enhanced.

EXAMPLES

The present invention is described in more detail below by the following Examples. However, these Examples are only illustrative and not intended to limit the invention thereto.

In the following Examples and Comparative Examples, Examples 1-1 to 1-4 and Comparative Examples 1-1 to 1-3 are those Examples and Comparative Examples relating to the Invention 1 in which the characteristic (A) is satisfied; Examples 2-1 to 2-4 and Comparative Examples 2-1 to 2-3 are those Examples and Comparative Examples relating to the Invention 1 in which the characteristic (B) is satisfied; Examples 3-1 to 3-6 and Comparative Examples 3-1 to 3-3 are those Examples and Comparative Examples relating to the Invention 4; and Examples 4-1 to 4-7 and Comparative Examples 4-1 to 4-8 are those Examples and Comparative Examples relating to the Inventions 15, 18 and 21. Meanwhile, the respective Comparative Examples relate to only the corresponding invention(s), and are not intended to serve for comparison with the other inventions. The evaluation methods used in the present invention are as follows.

The average primary particle diameter of the particles was determined as an average value of particle diameters read out on an SEM image observed using a scanning electron microscope "SEM-EDX" equipped with an energy disperse type X-ray analyzer (manufactured by Hitachi High-Technologies Corp.).

The average secondary particle diameter ($D_{50}$) of the particles was determined from a volume-based average particle diameter as measured by a wet laser method using a laser type particle size distribution measuring apparatus "MICROTRACK HRA" manufactured by Nikkiso Co., Ltd.

The BET specific surface area of the particles was determined as follows. That is, a sample was dried and deaerated at 120° C. under a nitrogen bas atmosphere for 45 min, and then the BET specific surface area thereof was measured using "MONOSORB" manufactured by Yuasa Ionics Corp.

The composition of the particles and the contents of impurities therein were determined as follows. That is, 0.2 g of a sample was dissolved under heating in 25 mL of a 20% hydrochloric acid solution, and the resulting solution was cooled and then charged together with pure water into a 100 mL measuring flask to prepare a sample solution. Then, the thus prepared sample solution was subjected to quantitative determination of the respective elements therein using ICAP "SPS-4000" manufactured by Seiko Denshi Kogyo Co., Ltd.

The packing density of the positive electrode active substance particles was measured as follows. That is, 40 g of the particle were weighed and charged into a 50 mL measuring cylinder, and then tapped 500 times using a "TAP DENSER" manufactured by Seishin Enterprises Co., Ltd., to read out a volume of the tapped particles and calculate a packing density (TD 500 times) of the particles therefrom.

The X-ray diffraction of the sample was measured using "RAD-IIA" and "Smart Lab" manufactured by Rigaku Co., Ltd. The measurement was conducted at a step scanning rate of 0.02° (hold time: 0.6 sec) in the range of 2θ/θ of 10 to 90°.

The S content was measured using "HORIBA CARBON/SULFUR ANALYZER EMIA-320V" (manufactured by HORIBA Scientific).

The endotherm in a low-temperature range was measured using a differential scanning colorimeter (DSC) "EXSTAR 6000 (DSC 6200)" manufactured by Seiko Instruments Inc. First, 20 mg of a sample were filled in an aluminum pan, and the aluminum pan was caulked and placed on a sample table using an alumina powder as a reference. Thereafter, an inside of a chamber in which the sample table was mounted was cooled to −40° C. with dry ice, and after removing the dry ice, the chamber was then heated to 70° C. at a temperature rise rate of 5° C./min to measure an endotherm of the sample.

The positive electrode active substance particles according to the present invention were evaluated for their battery characteristics using a coin cell of 2032 type.

The coin cell used for evaluation of the battery characteristics was produced as follows. That is, 85% by weight of the composite oxide as the positive electrode active substance particles, 5% by weight of acetylene black and 5% by weight of graphite as conductive agents, and 5% by weight of a solution prepared by dissolving polyvinylidene fluoride in N-methyl pyrrolidone as a binder were mixed with each other, and the resulting mixture was applied onto a metallic Al foil and dried at 120° C. The obtained sheet was blanked into 14 mmφ and then compressed at 1.5 t/cm² to produce a positive electrode. A 500 μm-thick metallic lithium sheet blanked into 16 mmφ was used as a negative electrode, and a mixed solution prepared by mixing EC and DMC with each other at a volume ratio of 1:2 in which 1 mol/L of $LiPF_6$ was dissolved was used as an electrolyte solution, thereby producing the coin cell of 2032 type.

In order to evaluate a cycle retention rate of the battery, the coin cell was produced by the same method as used above for producing the coin cell using the metallic Li foil as a counter electrode except that 94% by weight of artificial graphite as a negative electrode active substance and 6% by weight of a solution prepared by dissolving polyvinylidene fluoride in N-methyl pyrrolidone as a binder were mixed with each other, and the resulting mixture was applied onto a metallic Cu foil and dried at 120° C., and further the obtained sheet was blanked into 16 mmφ and used as a negative electrode.

The charge/discharge characteristics of the coin cell (Examples 1-series, Examples 2-series and Examples 4-series, and Comparative Examples 1-series, Comparative Examples 2-series and Comparative Examples 4-series) were determined as follows. That is, under the environmental condition within a constant-temperature oven maintained at 25° C., the coin cell was subjected to charging until reaching 5.0 V at a current density of 0.1 C (CC-CC operation), and then the coin cell was subjected to discharging until reaching 3.0 V at a current density of 0.1 C (CC-CC operation). In order to enhance a reliability of the measurement, the 1st cycle operation was conducted as aging, and the charge capacity (2nd-CH) and the discharge capacity (2nd-DCH) in the second operation (2nd cycle) were measured.

The charge/discharge characteristics of the coin cell (Examples 3-series and Comparative Examples 3-series) were determined as follows. That is, under the environmental condition within a constant-temperature oven maintained at 25° C., the coin cell was subjected to charging until reaching 5.0 V at a current density of 0.1 C (CC-CV operation; terminating condition: 1/100 C), and then the coin cell was subjected to discharging until reaching 3.0 V at a current density of 0.1 C (CC operation). In the initial charging, the charge capacity at 4.8 V was indicated by a, and the charge capacity at 5.0 V was indicated by b.

The initial charging until reaching 5.0 V was completed to determine the initial charge capacity b, and then the discharging until reaching 3.0 V was conducted at a current density of 0.1 C (CC operation). At this time, the discharge capacity at 3.0 V was indicated by c, and the initial charge/discharge efficiency was calculated from the formula of c/b×100.

The retention rate of the rate characteristic (rate retention rate) was determined as follows. That is, under the environmental condition within a constant-temperature oven maintained at 25° C., the coin cell was subjected to charging until reaching 5.0 V at a current density of 0.1 C (CC-CC operation), and then the coin cell was subjected to discharging until reaching 3.0 V at a current density of 0.1 C (CC-CC operation). In order to enhance a reliability of the measurement, the 1st cycle operation was conducted as aging, and the charge capacity (2nd-CH) and the discharge capacity (2nd-DCH) in the second operation (2nd cycle) were measured. At this time, the discharge capacity of the 2nd cycle was indicated by a. Next, the coin cell was subjected to charging until reaching 5.0 V at a current density of 0.1 C (CC-CC operation), and then the coin cell was subjected to discharging until reaching 3.0 V at a current density of 10 C (CC-CC operation). At this time, the discharge capacity was indicated by b, and the rate retention rate was calculated from the formula of (b/a×100(%)).

Using the coin cell of a 2032 type in which artificial graphite was used as a counter electrode, cycle characteristics thereof were evaluated. In the test for evaluating the cycle characteristics, under the environmental condition maintained at 25° C., 200 charge/discharge cycles were conducted at a current density of 1 C in the range of 3.0 to 4.8 V (CC-CC operation). At this time, the 1st cycle discharge capacity was indicated by c, and the 200th cycle discharge capacity was indicated by d, and the cycle retention rate was calculated from the formula of (d/c×100(%)).

Examples and Comparative Examples Relating to the Invention 1 in which the Characteristic (A) was Satisfied Example 1-1

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to nitrogen flow, and 117.3 L of a 0.3 mol/L manganese sulfate solution and 39.4 L of a 1.5 mol/L nickel sulfate solution were added thereto, thereby obtaining a water suspension comprising an oxide of manganese produced in the primary reaction as well as a manganese compound and a nickel compound (such as manganese hydroxide and nickel hydroxide). After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.75}Ni_{0.25})_3O_4$. Further, it was confirmed that the manganese/nickel composite oxide particles had an average primary particle diameter of 2.6 μm, a tap density of 2.12 g/mL (when tapped 500 times), a full-width at half maximum of a strongest peak of 0.20° as measured by X-ray diffraction, an Na content of 252 ppm, an S content of 88 ppm, and a total impurity content of 1589 ppm.

The resulting manganese/nickel composite oxide particles as a precursor and lithium carbonate were weighed such that the ratio of Li to a sum of Mn and Ni [Li:(Mn+Ni)] is 0.50:1.00 and dry-mixed with each other in a ball mill for 1 hr, thereby obtaining a uniform mixture. Thereafter, the resulting mixture was calcined under an oxygen flow at 750° C. for 15 hr in an electric furnace, and successively calcined at 600° C. for 10 hr, thereby obtaining positive electrode active substance particles.

As a result, it was confirmed that the thus obtained positive electrode active substance particles had a cubic system spinel structure as measured by an X-ray diffraction analyzer "RAD-IIA" manufactured by Rigaku Co., Ltd. Further, it was confirmed that the resulting positive electrode active substance particles had a peak intensity ratio of (311) plane to (111) plane of 38%, a BET specific surface area of 0.41 m²/g, D50 of 14.8 μm, a tap density of 1.98 g/mL, an S content of 21 ppm, an Na content of 98 ppm, and a total impurity content of 529 ppm.

In addition, the coin type cell produced using the positive electrode active substance particles had a discharge capacity until 3.0 V of 142 mAh/g and a discharge capacity until 4.5 V of 134 mAh/g, a rate retention rate of 87% and a cycle retention rate of 65%.

Example 1-2

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to nitrogen flow, and 117.3 L of a 0.3 mol/L manganese sulfate solution, 39.4 L of a 1.5 mol/L nickel sulfate solution, 20.0 L of a 1.5 mol/L titanyl sulfate solution and 10.0 L of a 1.5 mol/L magnesium sulfate solution were added thereto, thereby obtaining a water suspension comprising an oxide of manganese produced in the primary reaction as well as a manganese compound, a nickel compound, a magnesium compound and a titanium compound (such as manganese hydroxide, nickel hydroxide, magnesium hydroxide and titanium hydroxide). After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.72}Ni_{0.25}\ Mg_{0.015}Ti_{0.015})_3O_4$.

The resulting manganese/nickel composite oxide particles as a precursor and lithium carbonate were weighed such that the ratio of Li to a sum of Mn, Ni, Mg and Ti [Li:(Mn+Ni+Mg+Ti)] is 0.50:1.00 and dry-mixed with each other in a ball mill for 1 hr, thereby obtaining a uniform mixture. Thereafter, the resulting mixture was calcined under an oxygen flow at 750° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 1-1 to 1-3.

Example 1-3

An aqueous sodium hydroxide solution was prepared under a nitrogen flow such that a concentration of excess alkali after the reaction was 2.0 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to nitrogen flow, and 117.3 L of a 0.3 mol/L manganese sulfate solution, 39.4 L of a 1.5 mol/L nickel sulfate solution and 30.2 L of a 1.5 mol/L titanyl sulfate solution were added thereto, thereby obtaining a water suspension comprising an oxide of manganese produced in the primary reaction as well as a manganese compound, a nickel compound and a titanium compound (such as manganese hydroxide, nickel hydroxide and titanium hydroxide). After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.70}Ni_{0.25}Ti_{0.05})_3O_4$.

The resulting manganese/nickel composite oxide particles as a precursor and lithium carbonate were weighed such that the ratio of Li to a sum of Mn, Ni and Ti [Li:(Mn+Ni+Ti)] is 0.50:1.00 and dry-mixed with each other in a ball mill for 1 hr, thereby obtaining a uniform mixture. Thereafter, the resulting mixture was calcined under an oxygen flow at 850° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 1-1 to 1-3.

Example 1-4

The manganese/nickel composite oxide particles obtained in Example 1-1 and lithium carbonate were weighed such that the ratio of Li to a sum of Mn and Ni [Li:(Mn+Ni)] is 0.50:1.00, and dry-mixed with each other in a ball mill for 1 hr, thereby obtaining a uniform mixture. Thereafter, the resulting mixture was calcined under an oxygen flow at 900° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 1-1 to 1-3.

Example 1-5

The same procedure as in Example 1-1 was conducted except that the production conditions were changed variously, thereby obtaining positive electrode active substance particles.

The production conditions of the positive electrode active substance particles and various properties of the obtained positive electrode active substance particles are shown in Tables 1-1 to 1-3.

Comparative Example 1-1

A sealed type reaction vessel was charged with 14 L of water, and an inside of the reaction vessel was maintained at 50° C. while flowing a nitrogen gas therethrough. Further, a 1.5 mol/L Ni sulfate/Mn sulfate mixed aqueous solution, a 0.8 mol/L sodium carbonate aqueous solution and a 2 mol/L ammonia aqueous solution were successively added into the reaction vessel while strongly stirring such that the pH value of the resulting solution was adjusted to 8.2 (+0.2). During the reaction, a filtrate only was discharged out of the reaction system using a concentration device, whereas a solid component separated from the filtrate was retained in the reaction vessel. After the reaction was continued for 40 hr, a slurry comprising a co-precipitated product was obtained. The thus obtained slurry was filtered, and the resulting solid was washed with pure water, and then dried at 105° C. overnight, thereby obtaining precursor particles. As a result of X-ray diffraction measurement, it was confirmed that the resulting precursor particles comprised a carbonate as a main component.

The resulting precursor particles and lithium hydroxide were weighed such that the ratio of Li to a sum of Mn and Ni [Li:(Mn+Ni)] is 0.48:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 1-1 to 1-3.

Comparative Example 1-2

The precursor particles obtained in Comparative Example 1-1 and lithium hydroxide were weighed such that the ratio of Li to Me [Li:Me] is 0.50:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 1-1 to 1-3.

Comparative Example 1-3

The precursor particles obtained in Comparative Example 1-1 and lithium hydroxide were weighed such that the ratio of Li to Me [Li:Me] is 0.51:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 1-1 to 1-3.

TABLE 1-1

| Examples and Comparative Examples | Production conditions Compositional formula of nickel-containing positive electrode active substance |
|---|---|
| Example 1-1 | $LiNi_{0.5}Mn_{1.5}O_4$ |
| Example 1-2 | $LiNi_{0.5}Mn_{1.44}Mg_{0.03}Ti_{0.03}O_4$ |
| Example 1-3 | $LiNi_{0.5}Mn_{1.4}Ti_{0.1}O_4$ |
| Example 1-4 | $LiNi_{0.5}Mn_{1.5}O_4$ |
| Example 1-5 | $Li_{1.05}Ni_{0.5}Mn_{1.5}O_4$ |
| Comparative Example 1-1 | $Li_{0.96}Ni_{0.5}Mn_{1.5}O_4$ |
| Comparative Example 1-2 | $LiNi_{0.5}Mn_{1.5}O_4$ |
| Comparative Example 1-3 | $Li_{1.02}Ni_{0.5}Mn_{1.48}O_4$ |

| Examples and Comparative Examples | Production conditions | | Calcination temperature (° C.) |
|---|---|---|---|
| | Kind of M | Li/(Ni + Mn + M) (mol/mol) | |
| Example 1-1 | — | 0.50 | 750 |
| Example 1-2 | Mg/Ti | 0.50 | 750 |
| Example 1-3 | Ti | 0.50 | 850 |
| Example 1-4 | — | 0.50 | 900 |
| Example 1-5 | — | 0.53 | 750 |
| Comparative Example 1-1 | — | 0.48 | 1000 |
| Comparative Example 1-2 | — | 0.50 | 1000 |
| Comparative Example 1-3 | — | 0.51 | 1000 |

TABLE 1-2

| Examples and Comparative Examples | Properties of lithium-containing composite oxide particles | | | |
|---|---|---|---|---|
| | $I(311)/I(111)$ (%) | BET specific surface area (m²/g) | D50 (μm) | TD (tapped 500 times) (g/mL) |
| Example 1-1 | 38 | 0.41 | 14.8 | 1.98 |
| Example 1-2 | 40 | 0.51 | 9.5 | 2.02 |
| Example 1-3 | 41 | 0.49 | 10.1 | 2.07 |
| Example 1-4 | 38 | 0.31 | 13.1 | 2.08 |
| Example 1-5 | 36 | 0.48 | 10.0 | 2.24 |
| Comparative Example 1-1 | 46 | 0.49 | 15.1 | 1.91 |
| Comparative Example 1-2 | 47 | 0.54 | 15.8 | 1.92 |
| Comparative Example 1-3 | 50 | 0.55 | 15.5 | 1.95 |

| Examples and Comparative Examples | Properties of lithium-containing composite oxide particles | | | |
|---|---|---|---|---|
| | Na content (ppm) | S content (ppm) | Total impurity content (ppm) | Endotherm measured by DSC (J/mg) |
| Example 1-1 | 98 | 21 | 529 | 0.54 |
| Example 1-2 | 256 | 109 | 651 | 0.55 |
| Example 1-3 | 1412 | 431 | 2113 | 0.34 |
| Example 1-4 | 53 | 37 | 415 | 0.46 |
| Example 1-5 | 175 | 49 | 650 | 0.55 |
| Comparative Example 1-1 | 7321 | 615 | 8336 | 0.16 |
| Comparative Example 1-2 | 7256 | 642 | 8298 | 0.20 |
| Comparative Example 1-3 | 7210 | 639 | 8249 | 0.15 |

TABLE 1-3

| Examples and Comparative Examples | Battery characteristics | | | |
|---|---|---|---|---|
| | Discharge capacity at 3 V or more (mAh/g) | Discharge capacity at 4.5 V or more (mAh/g) | 10 C/0.1 C rate retention rate (%) | Cycle retention rate (full-cell: 200 cycles) (%) |
| Example 1-1 | 142 | 134 | 87 | 65 |
| Example 1-2 | 136 | 127 | 85 | 66 |
| Example 1-3 | 138 | 131 | 85 | 62 |
| Example 1-4 | 135 | 127 | 88 | 63 |
| Example 1-5 | 141 | 136 | 79 | 60 |
| Comparative Example 1-1 | 139 | 122 | 74 | 45 |
| Comparative Example 1-2 | 136 | 122 | 75 | 46 |
| Comparative Example 1-3 | 136 | 120 | 75 | 46 |

| Examples and Comparative Examples | Battery characteristics Counter electrode: metallic Li; after 30 cycles | | |
|---|---|---|---|
| | Discharge capacity at 3 V or more (mAh/g) | Discharge capacity at 3.5 V or more (mAh/g) | Capacity (3.5 V-3 V) (mAh/g) |
| Example 1-1 | 140 | 139 | 1.1 |
| Example 1-2 | 136 | 135 | 1.4 |
| Example 1-3 | 136 | 136 | 0.8 |
| Example 1-4 | 133 | 132 | 0.9 |
| Example 1-5 | 140 | 139 | 1.0 |
| Comparative Example 1-1 | 133 | 126 | 6.7 |
| Comparative Example 1-2 | 132 | 127 | 5.1 |
| Comparative Example 1-3 | 132 | 125 | 6.6 |

From the above results, it was confirmed that the positive electrode active substance particles according to the present invention had large charge/discharge capacities and therefore were effective as excellent positive electrode active substance particles for non-aqueous electrolyte secondary batteries.

Examples and Comparative Examples Relating to the Invention 1 in which the Characteristic (B) was Satisfied Example 2-1

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to nitrogen flow, and 117.3 L of a 0.3 mol/L manganese sulfate solution and 39.4 L of a 1.5 mol/L nickel sulfate solution were added thereto, thereby obtaining a water suspension comprising an oxide of manganese produced in the primary reaction as well as manganese hydroxide and nickel hydroxide. After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.75}Ni_{0.25})_3O_4$. (Further, it was confirmed that the manganese/nickel composite oxide particles had an average primary particle diameter of 2.6 μm, a tap density of 2.12 g/mL (when tapped 500 times), a full-width at half maximum of a strongest peak of 0.20° as measured by X-ray diffraction, an Na content of 252 ppm, an S content of 88 ppm, and a total impurity content of 1589 ppm.)

The resulting manganese/nickel composite oxide particles as a precursor and lithium carbonate were weighed such that the ratio of Li to a sum of Mn and Ni [Li:(Mn+Ni)] is 0.50:1.00 and dry-mixed with each other in a ball mill for 1 hr, thereby obtaining a uniform mixture. Thereafter, the resulting mixture was calcined under an oxygen flow at 750° C. for 15 hr in an electric furnace, and successively calcined at 600° C. for 10 hr, thereby obtaining positive electrode active substance particles.

As a result, it was confirmed that the thus obtained positive electrode active substance particles had a cubic system spinel structure as measured by an X-ray diffraction analyzer "RAD-IIA" manufactured by Rigaku Co., Ltd. Further, it was confirmed that the resulting positive electrode active substance particles had a gradient of Williamson-hall plot of 8.0×10', a BET specific surface area of 0.43 m²/g, D50 of 15.1 μm, a tap density of 1.95 g/mL, an S content of 18 ppm, an Na content of 95 ppm, and a total impurity content of 513 ppm.

In addition, the coin type cell produced using the positive electrode active substance particles had a discharge capacity until 3.0 V of 140 mAh/g and a discharge capacity until 4.5 V of 132 mAh/g, a rate retention rate of 88% and a cycle retention rate of 63%.

Example 2-2

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to nitrogen flow, and 117.3 L of a 0.3 mol/L manganese sulfate solution, 39.4 L of a 1.5 mol/L nickel sulfate solution, 20.0 L of a 1.5 mol/L titanyl sulfate solution and 10.0 L of a 1.5 mol/L magnesium sulfate solution were added thereto, thereby obtaining a water suspension comprising an oxide of manganese produced in the primary reaction as well as manganese hydroxide, nickel hydroxide, magnesium hydroxide and titanium hydroxide. After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.72}Ni_{0.25}Mg_{0.015}Ti_{0.015})_3O_4$.

The resulting manganese/nickel composite oxide particles as a precursor and lithium carbonate were weighed such that the ratio of Li to a sum of Mn, Ni, Mg and Ti [Li:(Mn+Ni+Mg+Ti)] is 0.50:1.00 and dry-mixed with each other in a ball mill for 1 hr, thereby obtaining a uniform mixture. Thereafter, the resulting mixture was calcined under an oxygen flow at 750° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 2-1 to 2-3.

Example 2-3

An aqueous sodium hydroxide solution was prepared under a nitrogen flow such that a concentration of excess alkali after the reaction was 2.0 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to a nitrogen flow, and 117.3 L of a 0.3 mol/L manganese sulfate solution, 39.4 L of a 1.5 mol/L nickel sulfate solution and 30.2 L of a 1.5 mol/L titanyl sulfate solution were added thereto, thereby obtaining a water suspension comprising an oxide of manganese produced in the primary reaction as well as manganese hydroxide, nickel hydroxide and titanium hydroxide. After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound precursor comprising $Mn_3O_4$ particles having a spinel structure as a base material. The precursor was calcined at 950° C. for 20 hr in atmospheric air, thereby obtaining manganese/nickel composite oxide particles as a precursor.

As a result of X-ray diffraction analysis, it was confirmed that the thus obtained manganese/nickel composite oxide particles had a cubic system spinel structure whose composition was $(Mn_{0.72}Ni_{0.25}Ti_{0.05})_3O_4$.

The resulting manganese/nickel composite oxide particles as a precursor and lithium carbonate were weighed such that the ratio of Li to a sum of Mn, Ni and Ti [Li:(Mn+Ni+Ti)] is 0.50:1.00 and dry-mixed with each other in a ball mill for 1 hr, thereby obtaining a uniform mixture. Thereafter, the resulting mixture was calcined under an oxygen flow at 850° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 2-1 to 2-3.

Example 2-4

The manganese/nickel composite oxide particles obtained in Example 2-1 and lithium carbonate were weighed such that the ratio of Li to a sum of Mn and Ni [Li:(Mn+Ni)] is 0.50:1.00 and dry-mixed with each other in a ball mill for 1 hr, thereby obtaining a uniform mixture. Thereafter, the resulting mixture was calcined under an oxygen flow at 900° C. for 15 hr in an electric furnace, and successively calcined at 600° C. for 10 hr, thereby obtaining positive electrode active substance particles.

The production conditions of the positive electrode active substance particles and various properties of the obtained positive electrode active substance particles are shown in Tables 2-1 to 2-3.

Example 2-5

The same procedure as in Example 2-1 was conducted except that the production conditions were changed variously, thereby obtaining positive electrode active substance particles.

The production conditions of the positive electrode active substance particles and various properties of the obtained positive electrode active substance particles are shown in Tables 2-1 to 2-3.

Comparative Example 2-1

A sealed type reaction vessel was charged with 14 L of water, and an inside of the reaction vessel was maintained at 50° C. while flowing a nitrogen gas therethrough. Further, a 1.5 mol/L Ni sulfate/Mn sulfate mixed aqueous solution, a 0.8 mol/L sodium carbonate aqueous solution and a 2 mol/L ammonia aqueous solution were successively added into the reaction vessel while strongly stirring such that the pH value of the resulting solution was adjusted to 8.2 (+0.2). During the reaction, a filtrate only was discharged out of the reaction system using a concentration device, whereas a solid component separated from the filtrate was retained in the reaction vessel. After the reaction was continued for 40 hr, a slurry comprising a co-precipitated product was obtained. The thus obtained slurry was filtered, and the resulting solid was washed with pure water, and then dried at 105° C. overnight, thereby obtaining precursor particles. As a result of X-ray diffraction measurement, it was confirmed that the resulting precursor particles comprised a carbonate as a main component.

The resulting precursor particles and lithium hydroxide were weighed such that the ratio of Li to a sum of Mn and Ni [Li:(Mn+Ni)] is 0.48:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 2-1 to 2-3.

Comparative Example 2-2

The precursor particles obtained in Comparative Example 2-1 and lithium hydroxide were weighed such that the ratio of Li to Me [Li:Me] is 0.50:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 2-1 to 2-3.

Comparative Example 2-3

The precursor particles obtained in Comparative Example 2-1 and lithium hydroxide were weighed such that the ratio of Li to Me [Li:Me] is 0.51:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Tables 2-1 to 2-3.

TABLE 2-1

| Examples and Comparative Examples | Production conditions Compositional formula of nickel-containing positive electrode active substance |
|---|---|
| Example 2-1 | $LiNi_{0.5}Mn_{1.5}O_4$ |
| Example 2-2 | $LiNi_{0.5}Mn_{1.44}Mg_{0.03}Ti_{0.03}O_4$ |
| Example 2-3 | $LiNi_{0.5}Mn_{1.4}Ti_{0.1}O_4$ |
| Example 2-4 | $LiNi_{0.5}Mn_{1.5}O_4$ |
| Example 2-5 | $Li_{1.05}Ni_{0.5}Mn_{1.5}O_4$ |
| Comparative Example 2-1 | $Li_{0.96}Ni_{0.5}Mn_{1.5}O_4$ |
| Comparative Example 2-2 | $LiNi_{0.5}Mn_{1.5}O_4$ |
| Comparative Example 2-3 | $Li_{1.02}Ni_{0.5}Mn_{1.48}O_4$ |

| Examples and Comparative Examples | Production conditions | | |
|---|---|---|---|
| | Kind of M | Li/(Ni + Mn + M) (mol/mol) | Calcination temperature (° C.) |
| Example 2-1 | — | 0.50 | 750 |
| Example 2-2 | Mg/Ti | 0.50 | 750 |
| Example 2-3 | Ti | 0.50 | 850 |
| Example 2-4 | — | 0.50 | 900 |
| Example 2-5 | — | 0.53 | 750 |

TABLE 2-1-continued

| | | | |
|---|---|---|---|
| Comparative Example 2-1 | — | 0.48 | 1000 |
| Comparative Example 2-2 | — | 0.50 | 1000 |
| Comparative Example 2-3 | — | 0.51 | 1000 |

TABLE 2-2

| | Properties of lithium-containing composite oxide particles | | | |
|---|---|---|---|---|
| Examples and Comparative Examples | Gradient by least square method in XRD | BET specific surface area ($m^2/g$) | D50 (μm) | TD (tapped 500 times) (g/mL) |
| Example 2-1 | $8.0 \times 10^{-4}$ | 0.43 | 15.1 | 1.95 |
| Example 2-2 | $8.5 \times 10^{-4}$ | 0.53 | 9.1 | 2.08 |
| Example 2-3 | $6.4 \times 10^{-4}$ | 0.48 | 10.4 | 2.11 |
| Example 2-4 | $4.4 \times 10^{-4}$ | 0.29 | 13.6 | 2.02 |
| Example 2-5 | $14.0 \times 10^{-4}$ | 0.48 | 10.0 | 2.24 |
| Comparative Example 2-1 | $1.2 \times 10^{-4}$ | 0.50 | 15.4 | 1.89 |
| Comparative Example 2-2 | $0.2 \times 10^{-4}$ | 0.54 | 15.4 | 1.96 |
| Comparative Example 2-3 | $0.9 \times 10^{-4}$ | 0.56 | 15.2 | 1.98 |

| | Properties of lithium-containing composite oxide particles | | | |
|---|---|---|---|---|
| Examples and Comparative Examples | Na content (ppm) | S content (ppm) | Total impurity content (ppm) | Endotherm measured by DSC (J/mg) |
| Example 2-1 | 95 | 18 | 513 | 0.53 |
| Example 2-2 | 242 | 100 | 660 | 0.67 |
| Example 2-3 | 1496 | 440 | 2369 | 0.39 |
| Example 2-4 | 49 | 32 | 481 | 0.44 |
| Example 2-5 | 175 | 49 | 650 | 0.55 |
| Comparative Example 2-1 | 7232 | 604 | 8236 | 0.17 |
| Comparative Example 2-2 | 7235 | 610 | 8245 | 0.22 |
| Comparative Example 2-3 | 7266 | 650 | 8316 | 0.15 |

TABLE 2-3

| | Battery characteristics | | | |
|---|---|---|---|---|
| Examples and Comparative Examples | Discharge capacity at 3 V or more (mAh/g) | Discharge capacity at 4.5 V or more (mAh/g) | 10 C/0.1 C rate retention rate (%) | Cycle retention rate (full-cell: 200 cycles) (%) |
| Example 2-1 | 140 | 132 | 88 | 63 |
| Example 2-2 | 140 | 132 | 91 | 68 |
| Example 2-3 | 137 | 127 | 88 | 65 |
| Example 2-4 | 135 | 127 | 88 | 62 |
| Example 2-5 | 141 | 136 | 79 | 60 |
| Comparative Example 2-1 | 139 | 122 | 74 | 45 |
| Comparative Example 2-2 | 136 | 122 | 75 | 46 |
| Comparative Example 2-3 | 136 | 120 | 75 | 46 |

TABLE 2-3-continued

| | Battery characteristics Counter electrode: metallic Li; after 30 cycles | | |
|---|---|---|---|
| Examples and Comparative Examples | Discharge capacity at 3 V or more (mAh/g) | Discharge capacity at 3.5 V or more (mAh/g) | Capacity (3.5 V-3 V) (mAh/g) |
| Example 2-1 | 138 | 137 | 0.9 |
| Example 2-2 | 139 | 138 | 0.9 |
| Example 2-3 | 134 | 133 | 0.9 |
| Example 2-4 | 133 | 132 | 0.9 |
| Example 2-5 | 140 | 139 | 1.0 |
| Comparative Example 2-1 | 133 | 126 | 6.7 |
| Comparative Example 2-2 | 132 | 127 | 5.1 |
| Comparative Example 2-3 | 132 | 125 | 6.6 |

From the above results, it was confirmed that the positive electrode active substance particles according to the present invention had large charge/discharge capacities and therefore were effective as excellent positive electrode active substance particles for non-aqueous electrolyte secondary batteries.

Examples and Comparative Examples Relating to the Invention 4

Example 3-1

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction). After completion of the primary reaction, the atmosphere within the reaction vessel was changed-over to a nitrogen flow, and 117.3 L of a 0.3 mol/L manganese sulfate solution and 39.4 L of a 1.5 mol/L nickel sulfate solution were added thereto, thereby obtaining a water suspension comprising an oxide of manganese produced in the primary reaction as well as a manganese compound and a nickel compound (such as manganese hydroxide and nickel hydroxide). After changing-over from the nitrogen flow to an air flow, the thus obtained solution was subjected to oxidation reaction at 60° C. (secondary reaction). After completion of the secondary reaction, the resulting product was washed with water and then dried, thereby obtaining a manganese/nickel composite compound comprising $Mn_3O_4$ particles having a spinel structure as a base material. The thus obtained manganese/nickel composite compound was calcined at 950° C. for 20 hr in atmospheric air, thereby obtaining manganese/nickel composite oxide particles.

As a result of X-ray diffraction analysis, it was confirmed that the thus obtained manganese/nickel composite oxide particles had a cubic system spinel structure belonging to a space group of Fd-3m whose composition was $(Mn_{0.75}Ni_{0.25})_3O_4$. Further, it was confirmed that the manganese/nickel composite oxide particles had an average primary particle diameter of 2.6 µm, a tap density of 2.12 g/mL (when tapped 500 times), a full-width at half maximum of a strongest peak of 0.20° as measured by X-ray diffraction, an Na content of 252 ppm, an S content of 88 ppm, and a total impurity content of 1589 ppm.

The resulting manganese/nickel composite oxide particles and lithium carbonate were weighed such that the ratio of Li to a sum of Mn and Ni [Li:(Mn+Ni)] is 0.50:1.00 and dry-mixed with each other in a ball mill for 1 hr, thereby obtaining a uniform mixture. Thereafter, the resulting mixture was calcined using an electric furnace at 750° C. for 15 hr in atmospheric air (calcination step (1)), and successively calcined at 600° C. for 10 hr (calcination step (2)), thereby obtaining positive electrode active substance particles.

As a result, it was confirmed that the thus obtained positive electrode active substance particles had a cubic system spinel structure as measured by an X-ray diffraction analyzer "Smart Lab" manufactured by Rigaku Co., Ltd. The X-ray diffraction pattern of the thus obtained positive electrode active substance particles is shown in FIG. 3-1. Further, it was confirmed that the resulting positive electrode active substance particles had a composition represented by the formula of $Li_{1.0}(Mn_{0.75}Ni_{0.25})_2O_4$, an average primary particle diameter of 3.5 µm, an average secondary particle diameter (D50) of 11.6 µm, a BET specific surface area of 0.74 m$^2$/g, a product of the average secondary particle diameter (D50) and the BET specific surface area of 8.6× 10$^{-6}$ m$^3$/g, and a full-width at half maximum of (400) plane of 0.171°.

Figures 1, 2:
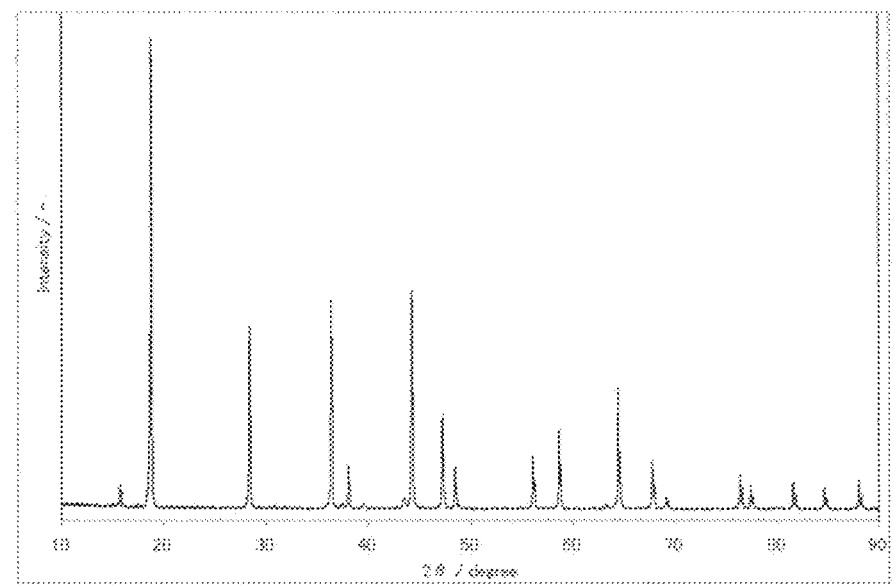
Figures 1, 2, 3:
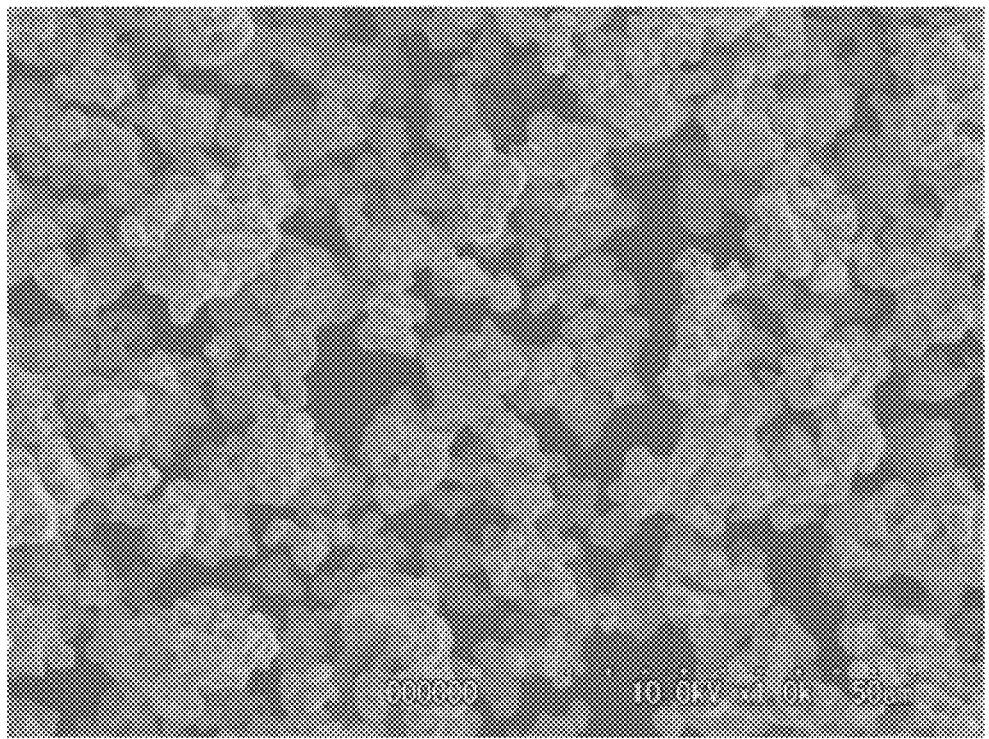

In addition, the coin type cell produced using the positive electrode active substance particles in which metallic lithium was used as a counter electrode had a charge capacity a until 4.8 V of 140.2 mAh/g and a charge capacity b until 5.0 V of 155.2 mAh/g when subjected to initial charging, a ratio of (b−a)/b of 9.6% as shown in FIGS. 3-2, and an initial charge/discharge efficiency of 92.8%.

Examples 3-2 to 3-7

The same procedure as in Example 3-1 was conducted except that the calcination temperature used in the calcination step (1) was changed variously, thereby obtaining positive electrode active substance particles.

The production conditions of the positive electrode active substance particles and various properties of the obtained positive electrode active substance particles are shown in Table 3-1.

Comparative Example 3-1

The same procedure as in Example 3-1 was conducted except that the calcination temperature used in the calcination step (1) was changed to 650° C., thereby obtaining positive electrode active substance particles.

Comparative Example 3-2

A sealed type reaction vessel was charged with 14 L of water, and an inside of the reaction vessel was maintained at 50° C. while flowing a nitrogen gas therethrough. Further, a 1.5 mol/L Ni sulfate/Mn sulfate mixed aqueous solution, a 0.8 mol/L sodium carbonate aqueous solution and a 2 mol/L ammonia aqueous solution were successively added into the reaction vessel while strongly stirring such that the pH value of the resulting solution was adjusted to 8.2 (+0.2). During the reaction, a filtrate only was discharged out of the reaction system using a concentration device, whereas a solid component separated from the filtrate was retained in the reaction vessel. After the reaction was continued for 40 hr, a slurry comprising a co-precipitated product was obtained. The thus obtained slurry was filtered, and the resulting solid was washed with pure water, and then dried at 105° C. overnight, thereby obtaining precursor particles. As a result of X-ray diffraction measurement, it was confirmed that the resulting precursor particles comprised a carbonate as a main component.

The resulting precursor particles and lithium hydroxide were weighed such that the ratio of Li to a sum of Mn and Ni [Li:(Mn+Ni)] is 0.50:1.00 and intimately mixed with each other, thereby obtaining a mixture. Thereafter, the resulting mixture was calcined using an electric furnace at 850° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Table 3-1.

Comparative Example 3-3

The precursor particles obtained in Comparative Example 3-2 and lithium hydroxide were weighed such that the ratio of Li to Me [Li:Me] is 0.50:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The production conditions of the positive electrode active substance particles and various properties of the obtained positive electrode active substance particles are shown in Table 3-1.

TABLE 3-1

| Examples and Comparative Examples | Calcination temperature (° C.) | Average primary particle diameter (µm) | Average secondary particle diameter D50 (µm) | BET specific surface area (m$^2$/g) |
|---|---|---|---|---|
| Example 3-1 | 750 | 3.5 | 11.6 | 0.74 |
| Example 3-2 | 800 | 3.5 | 11.5 | 0.62 |
| Example 3-3 | 850 | 3.5 | 11.0 | 0.53 |
| Example 3-4 | 900 | 3.5 | 11.3 | 0.49 |
| Example 3-5 | 700 | 3.5 | 11.6 | 0.80 |
| Example 3-6 | 1050 | 3.5 | 12.1 | 0.42 |
| Example 3-7 | 750 | 3.5 | 10.0 | 0.48 |
| Comparative Example 3-1 | 650 | 3.5 | 11.0 | 1.10 |
| Comparative Example 3-2 | 850 | 0.5 | 13.0 | 3.40 |
| Comparative Example 3-3 | 1000 | 5.5 | 18.0 | 0.60 |

| Examples and Comparative Examples | BET × primary particle diameter (×10$^{-6}$) (m$^3$/g) | BET × secondary particle diameter (×10$^{-6}$) (m$^3$/g) | FWHM*: (111)plane (degree) | FWHM*: (311)plane (degree) |
|---|---|---|---|---|
| Example 3-1 | 2.6 | 8.6 | 0.086 | 0.139 |
| Example 3-2 | 2.2 | 7.1 | 0.113 | 0.128 |
| Example 3-3 | 1.9 | 5.8 | 0.112 | 0.131 |
| Example 3-4 | 1.7 | 5.5 | 0.083 | 0.13 |
| Example 3-5 | 2.8 | 9.3 | 0.119 | 0.165 |
| Example 3-6 | 1.5 | 5.1 | 0.094 | 0.088 |
| Example 3-7 | 1.7 | 4.8 | 0.087 | 0.142 |

TABLE 3-1-continued

| | | | | |
|---|---|---|---|---|
| Comparative Example 3-1 | 3.9 | 12.1 | 0.121 | 0.186 |
| Comparative Example 3-2 | 1.7 | 44.2 | 0.259 | 0.212 |
| Comparative Example 3-3 | 3.3 | 10.8 | 0.141 | 0.141 |

| Examples and Comparative Examples | FWHM* z: (400)plane (degree) | FWHM*: (440)plane (degree) | Initial charge capacity b at 5.0 V (mAh/g) | Initial charge capacity a at 4.8 V (mAh/g) |
|---|---|---|---|---|
| Example 3-1 | 0.171 | 0.173 | 155.2 | 140.2 |
| Example 3-2 | 0.139 | 0.154 | 153.0 | 141.6 |
| Example 3-3 | 0.149 | 0.161 | 153.8 | 142.9 |
| Example 3-4 | 0.147 | 0.159 | 150.4 | 141.1 |
| Example 3-5 | 0.217 | 0.231 | 154.7 | 139.5 |
| Example 3-6 | 0.096 | 0.105 | 150.7 | 137.2 |
| Example 3-7 | 0.163 | 0.188 | 147.9 | 136.0 |
| Comparative Example 3-1 | 0.256 | 0.286 | 160.0 | 135.0 |
| Comparative Example 3-2 | 0.165 | 0.235 | 150.0 | 115.0 |
| Comparative Example 3-3 | 0.118 | 0.141 | 142.0 | 125.0 |

| Examples and Comparative Examples | (b-a) (mAh/g) | (b-a)/ b × 100 (%) | Initial charge capacity c (mAh/g) | Charge/discharge efficiency (c/b × 100) (%) |
|---|---|---|---|---|
| Example 3-1 | 15.0 | 9.6 | 144.0 | 92.8 |
| Example 3-2 | 11.4 | 7.5 | 142.7 | 93.3 |
| Example 3-3 | 10.9 | 7.1 | 143.3 | 93.2 |
| Example 3-4 | 9.4 | 6.2 | 142.8 | 95.0 |
| Example 3-5 | 15.2 | 9.8 | 144.2 | 93.2 |
| Example 3-6 | 13.6 | 9.0 | 143.0 | 94.8 |
| Example 3-7 | 11.9 | 8.0 | 141.0 | 95.3 |
| Comparative Example 3-1 | 25.0 | 15.6 | 140.0 | 87.5 |
| Comparative Example 3-2 | 35.0 | 23.3 | 130.0 | 86.7 |
| Comparative Example 3-3 | 17.0 | 12.0 | 135.0 | 95.1 |

Note:
FWHM*: Full-width at half maximum

Figures 1, 2, 3, 4:
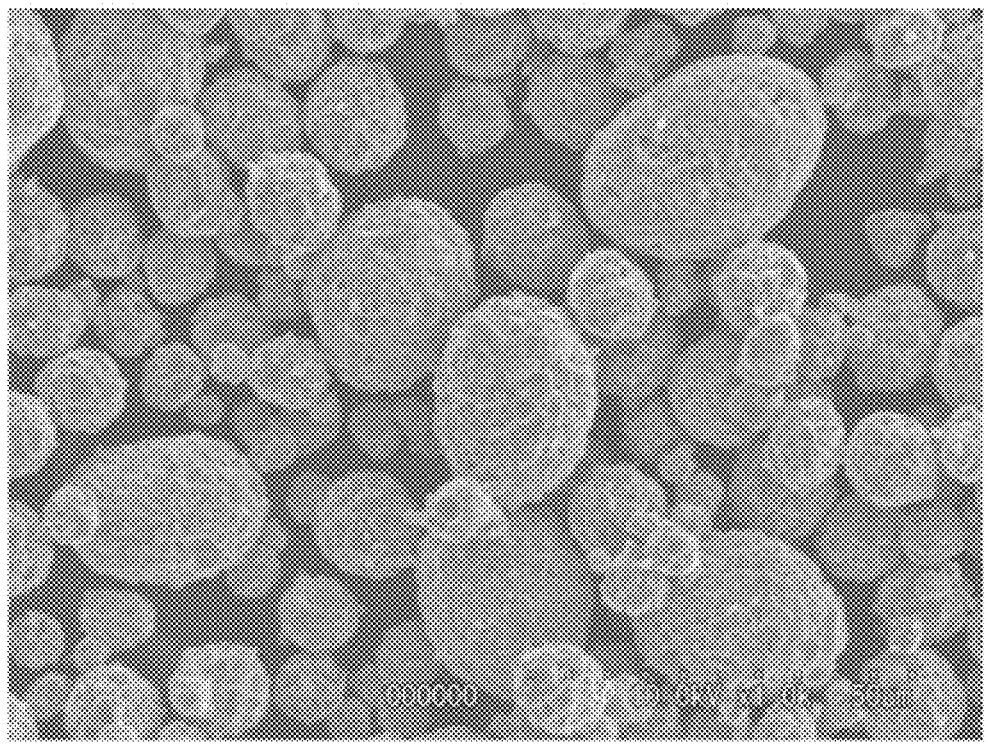
Figures 1, 2:
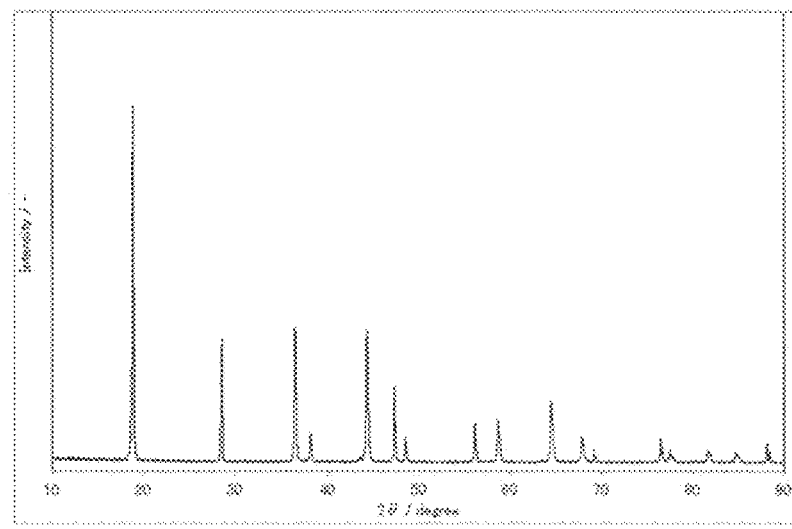
Figure 2:
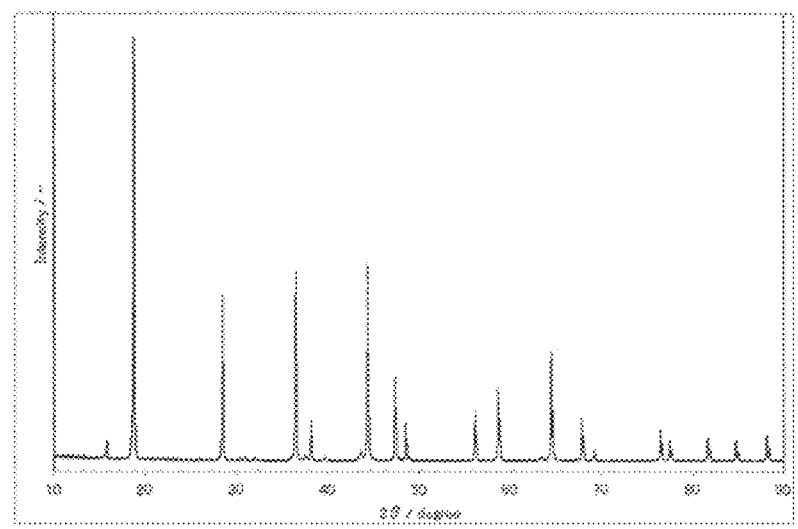
Figures 2, 3:
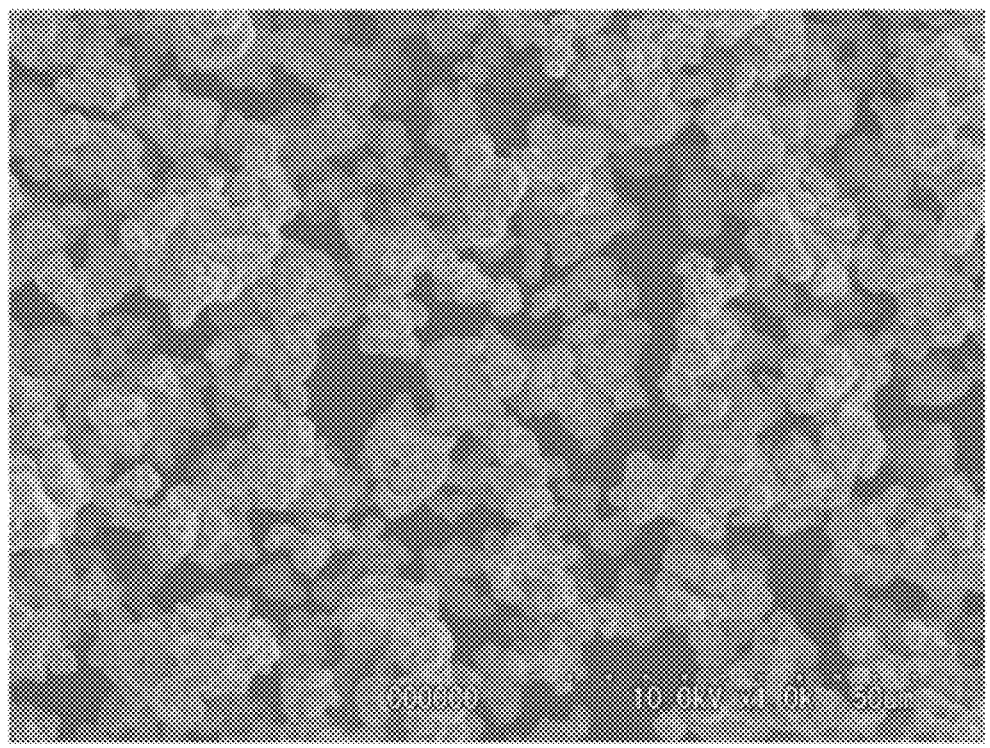
Figures 2, 3, 4:
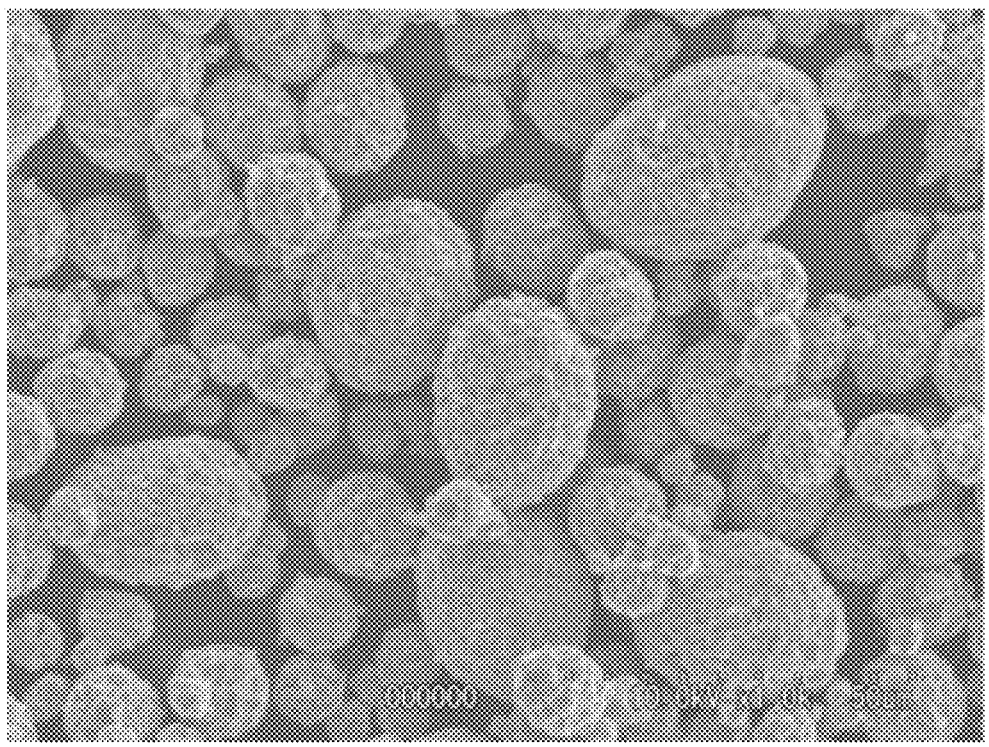
Figures 1, 3:
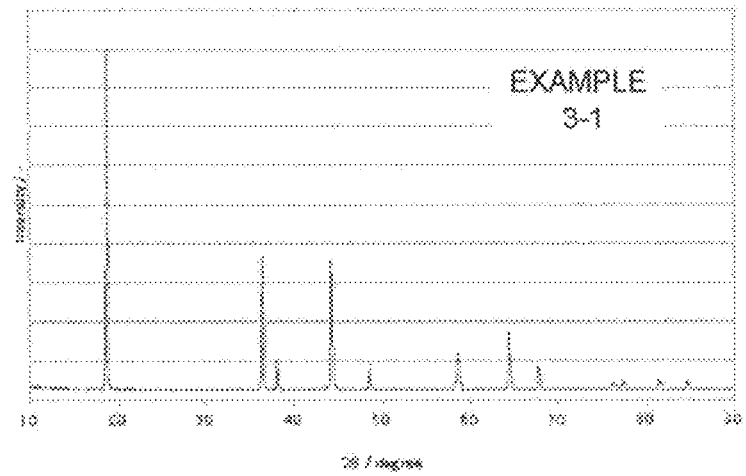
Figures 2, 3:
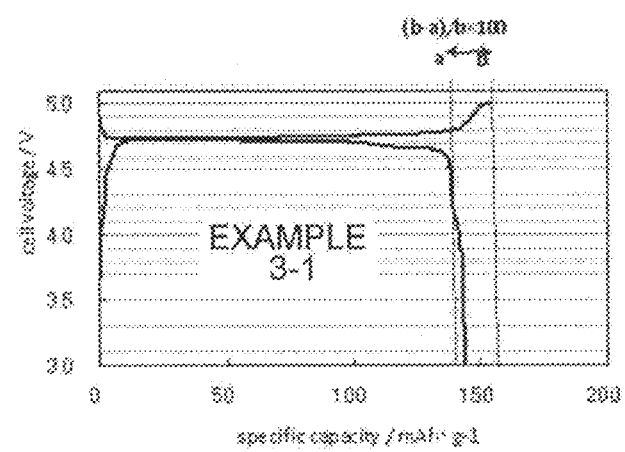
Figure 3:
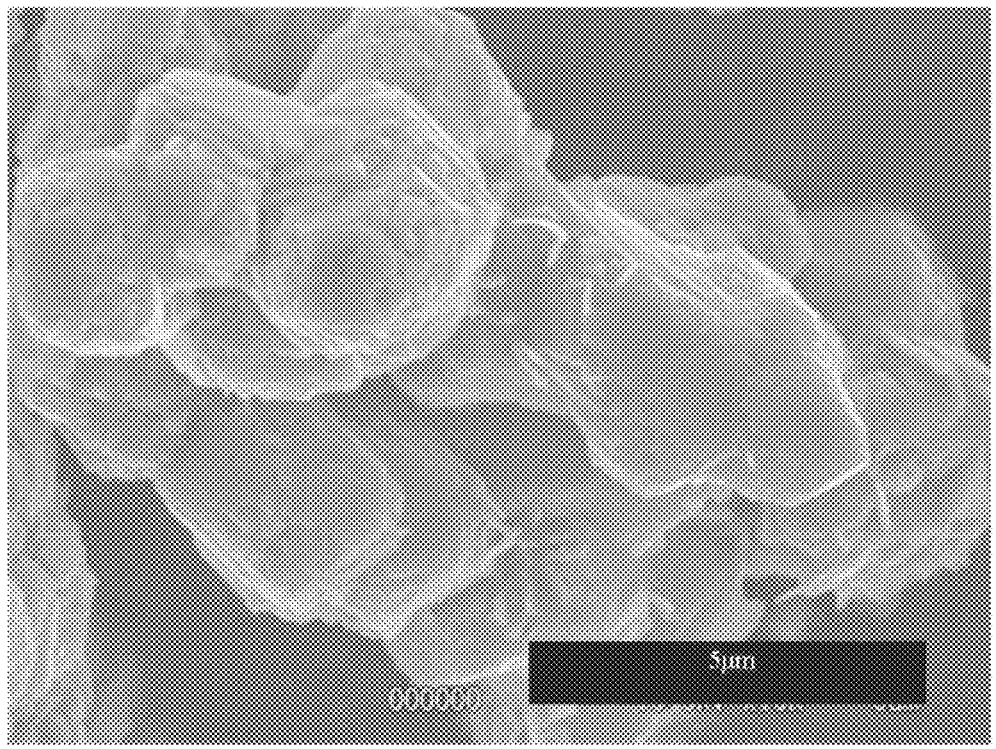
Figures 3, 4:
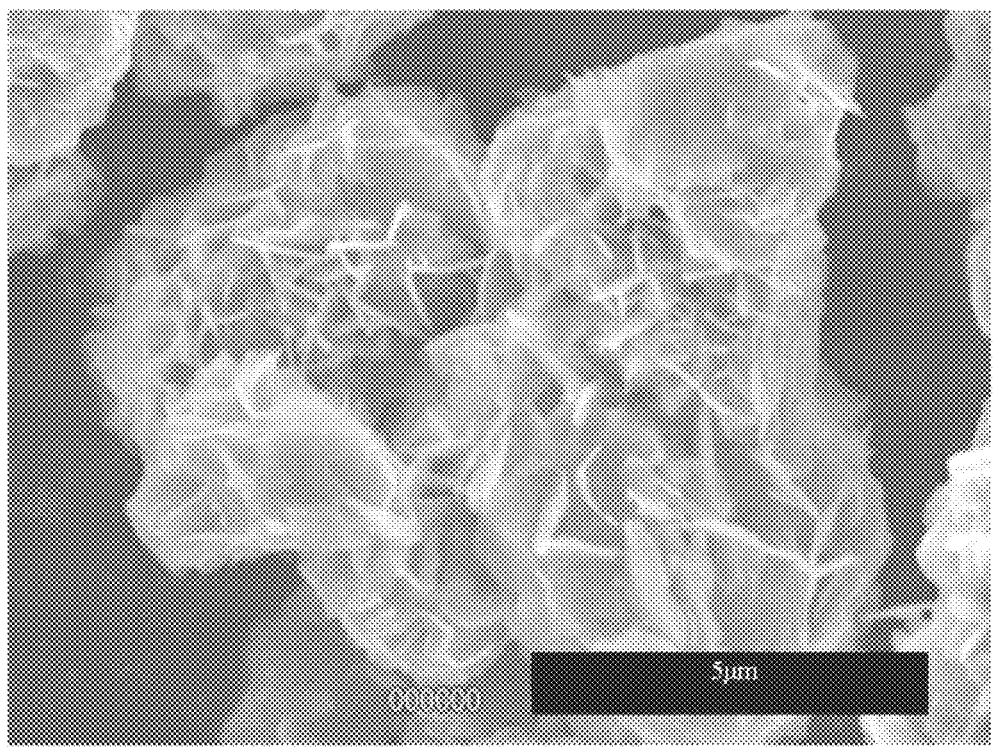
Figures 1, 4:
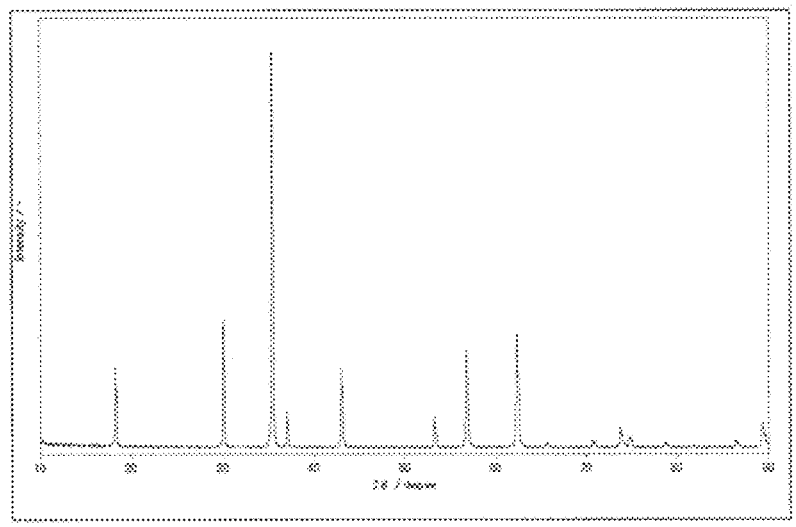
Figures 2, 4:
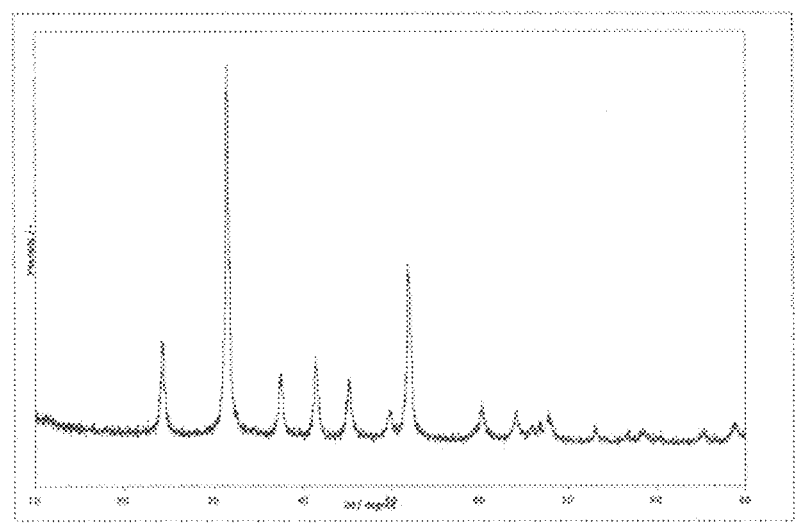
Figures 3, 4:
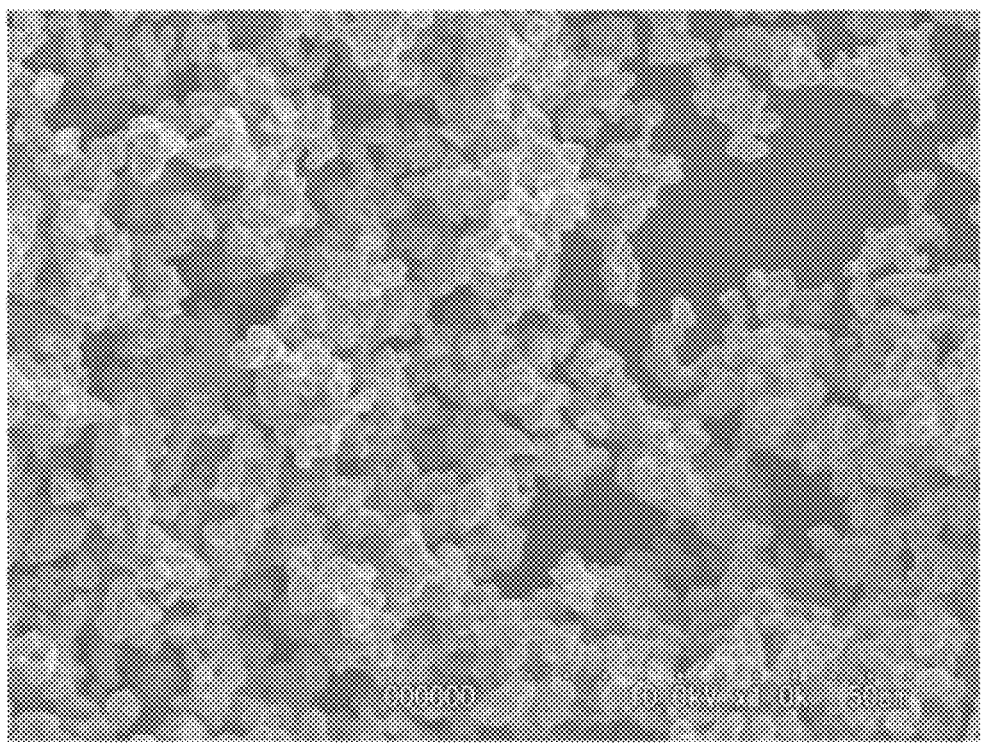
Figure 4:
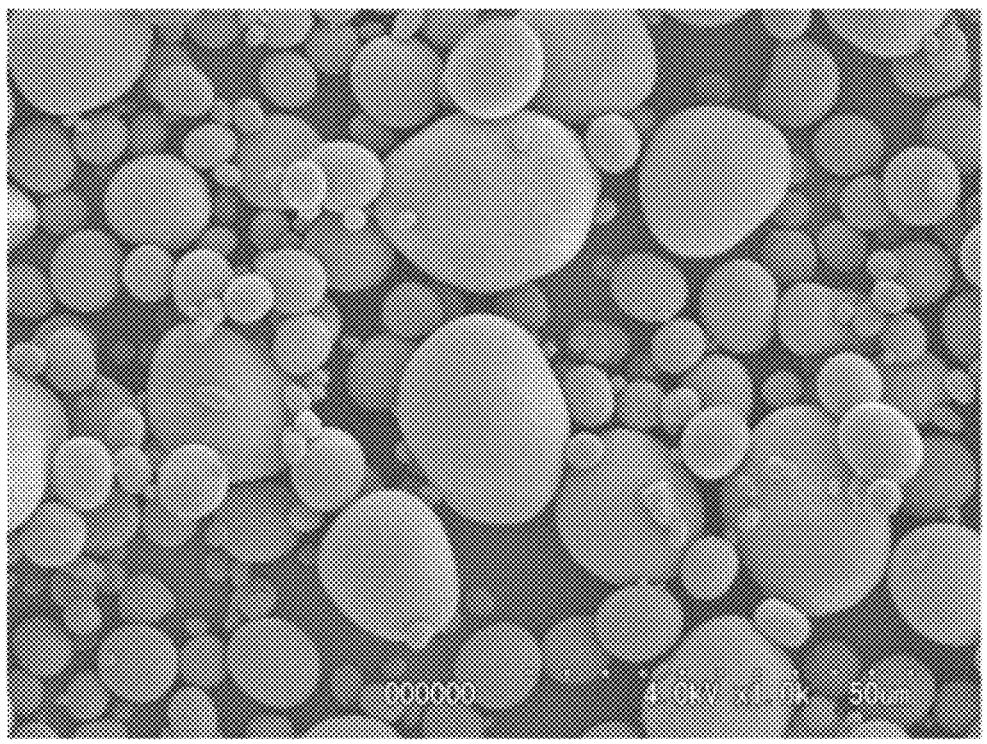

FIG. 3-3 shows a scanning electron micrograph of the positive electrode active substance particles obtained in Example 3-1, and FIG. 3-4 shows a scanning electron micrograph of the positive electrode active substance particles obtained in Comparative Example 3-1. As apparently recognized from FIG. 3-3 and FIG. 3-4, the secondary particles of the positive electrode active substance particles obtained in Example 3-1 were provided on a surface thereof with less irregularities as compared to those of the positive electrode active substance particles obtained in Comparative Example 3-1.

From the above results, it was confirmed that the positive electrode active substance particles according to the present invention hardly suffered from side reactions with an electrolyte solution, and therefore were effective as positive electrode active substance particles for non-aqueous electrolyte secondary batteries having an excellent long-term stability.

Examples and Comparative Examples Relating to the Inventions 15, 18 and 21

Example 4-1

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction).

After completion of the primary reaction, the atmosphere within the reaction vessel was changed-over to a nitrogen flow, and 117.3 L of a 0.3 mol/L manganese sulfate solution and 39.4 L of a 1.5 mol/L nickel sulfate solution were added thereto, thereby obtaining a water suspension comprising an oxide of manganese produced in the primary reaction as well as compounds of additive metal elements (such as manganese hydroxide and nickel hydroxide). After changing-over from the nitrogen flow to an air flow, the thus obtained reaction solution was subjected to oxidation reaction at 60° C. (secondary reaction). After completion of the secondary reaction, the resulting product was washed with water and then dried, thereby obtaining a manganese/nickel composite compound (intermediate product) comprising $Mn_3O_4$ particles having a spinel structure as a base material. The intermediate product was calcined at 950° C. for 20 hr in atmospheric air, thereby obtaining manganese/nickel composite oxide particles.

As a result of X-ray diffraction analysis, it was confirmed that the thus obtained manganese/nickel composite oxide particles had a cubic system spinel structure (FIG. 4-1) whose composition was $(Mn_{0.75}Ni_{0.25})_3O_4$. Further, it was confirmed that the manganese/nickel composite oxide particles had an average primary particle diameter of 2.6 µm, a tap density of 2.12 g/mL (when tapped 500 times), a full-width at half maximum of a strongest peak of 0.20° as measured by X-ray diffraction, an Na content of 252 ppm, an S content of 88 ppm, and a total impurity content of 1589 ppm. An electron micrograph (SEM) of the thus obtained manganese/nickel composite oxide particles is shown in FIG. 4-3.

Example 4-2

An aqueous sodium hydroxide solution was prepared under a nitrogen flow such that a concentration of excess alkali after the reaction was 2.5 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction).

After completion of the primary reaction, the atmosphere within the reaction vessel was changed-over to nitrogen flow, and 117.3 L of a 0.3 mol/L manganese sulfate solution, 39.4 L of a 1.5 mol/L nickel sulfate solution, 10.0 L of a 1.5 mol/L titanyl sulfate solution and 10.0 L of a 1.5 mol/L magnesium sulfate solution were added thereto, thereby obtaining a water suspension comprising an oxide of manganese produced in the primary reaction as well as compounds of additive metal elements (such as manganese hydroxide, nickel hydroxide, magnesium hydroxide and titanium hydroxide). After changing-over from the nitrogen flow to an air flow, the thus obtained reaction solution was subjected to oxidation reaction at 60° C. (secondary reaction). After completion of the secondary reaction, the resulting product was washed with water and then dried, thereby obtaining a manganese/nickel composite compound (intermediate product) comprising $Mn_3O_4$ particles having a spinel structure as a base material.

The thus obtained intermediate product was calcined at 950° C. for 20 hr in atmospheric air, thereby obtaining manganese/nickel composite oxide particles. As a result of X-ray diffraction analysis, it was confirmed that the thus obtained manganese/nickel composite oxide particles had a crystal structure of a cubic system type (spinel structure).

Various properties of the resulting manganese/nickel composite oxide particles are shown in Table 4-1.

Example 4-3

An aqueous sodium hydroxide solution was prepared under a nitrogen flow such that a concentration of excess alkali after the reaction was 2.0 mol/L and an aqueous manganese sulfate solution was prepared such that a manganese concentration therein was 0.6 mol/L, and both of the aqueous solutions were charged into a reaction vessel such that a total volume therein was 600 L. The contents of the reaction vessel were neutralized to thereby obtain a water suspension comprising manganese hydroxide particles. After changing-over from the nitrogen flow to an air flow, the thus obtained water suspension comprising manganese hydroxide particles was subjected to oxidation reaction at 90° C. (primary reaction).

After completion of the primary reaction, the atmosphere within the reaction vessel was changed-over to a nitrogen flow, and 117.3 L of a 0.3 mol/L manganese sulfate solution, 39.4 L of a 1.5 mol/L nickel sulfate solution and 50.2 L of a 1.5 mol/L titanyl sulfate solution were added thereto, thereby obtaining a water suspension comprising an oxide of manganese produced in the primary reaction as well as compounds of additive metal elements (such as manganese hydroxide, nickel hydroxide and titanium hydroxide). After changing-over from the nitrogen flow to an air flow, the thus obtained solution was subjected to oxidation reaction at 60° C. (secondary reaction).

After completion of the secondary reaction, the resulting product was washed with water and then dried, thereby obtaining a manganese/nickel composite compound (intermediate product) comprising $Mn_3O_4$ particles having a spinel structure as a base material.

The thus obtained intermediate product was calcined at 950° C. for 20 hr in atmospheric air, thereby obtaining manganese/nickel composite oxide particles. As a result of X-ray diffraction analysis, it was confirmed that the thus obtained manganese/nickel composite oxide particles had a crystal structure of a cubic system type (spinel structure).

Various properties of the resulting manganese/nickel composite oxide particles are shown in Table 4-1.

Examples 4-4 and 4-5

The same procedure as in Example 4-1 was conducted except that the production conditions were changed variously, thereby obtaining manganese/nickel composite oxide particles.

Various properties of the resulting manganese/nickel composite oxide particles are shown in Table 4-1.

Comparative Example 4-1

A sealed type reaction vessel was charged with 14 L of water, and an inside of the reaction vessel was maintained at 50° C. while flowing a nitrogen gas therethrough. Further, a 1.5 mol/L Ni sulfate/Mn sulfate mixed aqueous solution, a 0.8 mol/L sodium carbonate aqueous solution and a 2 mol/L ammonia aqueous solution were successively added into the reaction vessel while strongly stirring such that the pH value of the resulting solution was adjusted to 8.2 (+0.2). During the reaction, a filtrate only was discharged out of the reaction system using a concentration device, whereas a solid component separated from the filtrate was retained in the reaction vessel. After the reaction was continued for 40 hr, a slurry comprising a co-precipitated product was obtained. The thus obtained slurry was filtered, and the resulting solid was washed with pure water, and then dried at 105° C. overnight, thereby obtaining precursor particles. As a result of X-ray diffraction measurement, it was confirmed that the resulting precursor particles comprised a carbonate as a main component (FIG. 4-2). An electron micrograph (SEM) of the thus obtained precursor particles is shown in FIG. 4-4.

Comparative Example 4-2

The manganese/nickel composite compound (intermediate product) was prepared by the same method as in Example 4-1 and then dried, and the dried particles were calcined at 880° C. for 20 hr in atmospheric air, thereby obtaining manganese/nickel composite oxide particles. As a result of subjecting the thus obtained manganese/nickel composite oxide particles to X-ray diffraction analysis, a peak attributed to $Mn_2O_3$ was observed in addition to the peak attributed to the manganese/nickel composite oxide having a spinel structure as a main structure.

Various properties of the resulting manganese/nickel composite oxide particles are shown in Table 4-1.

Comparative Example 4-3

A sealed type reaction vessel was charged with 14 L of water, and an inside of the reaction vessel was maintained at 50° C. while flowing a nitrogen gas therethrough. Further, a 1.5 mol/L Ni sulfate/Mn sulfate mixed aqueous solution, a 0.8 mol/L sodium carbonate aqueous solution and a 2 mol/L ammonia aqueous solution were successively added into the reaction vessel while strongly stirring such that the pH value of the resulting solution was adjusted to 8.2 (+0.2). During the reaction, a filtrate only was discharged out of the reaction system using a concentration device, whereas a solid component separated from the filtrate was retained in the reaction vessel. After the reaction was continued for 40 hr, a slurry comprising a co-precipitated product was obtained. The thus obtained slurry was filtered, and the resulting solid was washed with pure water, and then dried at 105° C. overnight, thereby obtaining precursor particles. As a result of X-ray diffraction measurement, it was confirmed that the resulting precursor particles comprised a hydroxide (partially converted into an oxide by drying) as a main component.

Various properties of the resulting manganese/nickel compound are shown in Table 4-1.

Example 4-6

The manganese/nickel composite oxide particles obtained in Example 4-1 and lithium carbonate were weighed such that the ratio of Li to a sum of Mn and Ni [Li:(Mn+Ni)] is 0.50:1.00 and dry-mixed with each other in a ball mill for 1 hr, thereby obtaining a uniform mixture. Thereafter, the resulting mixture was calcined under an oxygen flow at 750° C. for 15 hr in an electric furnace, and successively calcined at 600° C. for 10 hr, thereby obtaining positive electrode active substance particles.

As a result, it was confirmed that the thus obtained positive electrode active substance particles had a cubic system spinel structure as measured by an X-ray diffraction analyzer "RAD-IIA" manufactured by Rigaku Co., Ltd. Further, it was confirmed that the resulting positive electrode active substance particles had a BET specific surface area of 0.43 m$^2$/g, D50 of 15.1 μm, a tap density of 1.95 g/mL, an S content of 18 ppm, an Na content of 95 ppm, and a total impurity content of 513 ppm.

In addition, the coin type cell produced using the positive electrode active substance particles had a discharge capacity until 3.0 V of 140 mAh/g and a discharge capacity until 4.5 V of 132 mAh/g, a rate retention rate of 88% and a cycle retention rate of 63%.

Examples 4-7 and 4-8

The same procedure as in Example 4-6 was conducted except that the kind of manganese/nickel composite oxide particles, the mixing ratio between the manganese/nickel composite oxide particles and lithium carbonate, and the calcination temperature were changed variously, thereby obtaining positive electrode active substance particles. As a result of X-ray diffraction analysis, it was confirmed that the resulting positive electrode active substance particles all had a cubic system spinel structure.

The results of analysis of the resulting positive electrode active substance particles are shown in Table 4-2.

Example 4-9

A mixture of the manganese/nickel composite oxide particles obtained in Example 4-1 and lithium carbonate was calcined under an air flow at 900° C. for 15 hr, and successively calcined at 600° C. for 10 hr, thereby obtaining positive electrode active substance particles. As a result of X-ray diffraction analysis, it was confirmed that the resulting positive electrode active substance particles all had a cubic system spinel structure.

The results of analysis of the resulting positive electrode active substance particles are shown in Table 4-2.

Example 4-10

A mixture of the manganese/nickel composite oxide particles obtained in Example 4-5 and lithium carbonate was calcined under an air flow at 750° C. for 15 hr, and successively calcined at 600° C. for 10 hr, thereby obtaining positive electrode active substance particles. As a result of X-ray diffraction analysis, it was confirmed that the resulting positive electrode active substance particles all had a cubic system spinel structure.

The results of analysis of the resulting positive electrode active substance particles are shown in Table 4-2.

Comparative Example 4-4

The precursor particles obtained in Comparative Example 4-1 and lithium hydroxide were weighed such that the ratio of Li to Me [Li:Me] is 0.48:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The results of analysis of the resulting positive electrode active substance particles are shown in Table 4-2.

Comparative Example 4-5

The precursor particles obtained in Comparative Example 4-1 and lithium hydroxide were weighed such that the ratio of Li to Me [Li:Me] is 0.50:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The results of analysis of the resulting positive electrode active substance particles are shown in Table 4-2.

Comparative Example 4-6

The precursor particles obtained in Comparative Example 4-1 and lithium hydroxide were weighed such that the ratio of Li to Me [Li:Me] is 0.51:1.00 and intimately mixed with each other, thereby obtaining a mixture. Thereafter, the resulting mixture was calcined using an electric furnace at 1000° C. for 8 hr in atmospheric air, and successively calcined at 600° C. for 6 hr, thereby obtaining positive electrode active substance particles.

The results of analysis of the resulting positive electrode active substance particles are shown in Table 4-2.

Comparative Example 4-7

The same procedure as in Example 4-6 was conducted except that the composite oxide obtained in Comparative Example 4-2 was used as a precursor and mixed with the Li compound, and the resulting mixture was calcined, thereby obtaining positive electrode active substance particles. As a result of subjecting the thus obtained positive electrode active substance particles to X-ray diffraction analysis, it was confirmed that peaks attributed to nickel-containing lithium manganate, nickel oxide and lithium manganate particles derived from $Mn_2O_3$ were observed. The reason therefor is considered to be that the amount of Mn in the manganese/nickel composite oxide was reduced owing to occurrence of hetero phases therein, so that the amount of Ni therein was relatively increased.

The results of analysis of the resulting positive electrode active substance particles are shown in Table 4-2.

Comparative Example 4-8

The same procedure as in Example 4-9 was conducted except that the composite oxide obtained in Comparative Example 4-3 was used as a precursor and mixed with the Li compound, and the resulting mixture was calcined, thereby obtaining positive electrode active substance particles. As a result of subjecting the thus obtained positive electrode active substance particles to X-ray diffraction analysis, it was confirmed that peaks attributed to nickel-containing lithium manganate, nickel oxide and lithium manganate particles derived from $Mn_2O_3$ were observed. The reason therefor is considered to be that the amount of Mn in the manganese/nickel composite oxide was reduced owing to occurrence of hetero phases therein, so that the amount of Ni therein was relatively increased.

The results of analysis of the resulting positive electrode active substance particles are shown in Table 4-2.

TABLE 4-1

| Examples and Comparative Examples | Compositional formula of nickel/manganese composite compound |
|---|---|
| Example 4-1 | $(Mn_{0.75}Ni_{0.25})_3O_4$ |
| Example 4-2 | $(Mn_{0.73}Ni_{0.25}Mg_{0.01}Ti_{0.01})O_4$ |
| Example 4-3 | $(Mn_{0.68}Ni_{0.25}Ti_{0.07})O_4$ |
| Example 4-4 | $(Mn_{0.75}Ni_{0.25})_3O_4$ |
| Example 4-5 | $(Mn_{0.75}Ni_{0.25})_3O_4$ |
| Comparative Example 4-1 | $(Mn_{0.75}Ni_{0.25})CO_3$ |
| Comparative Example 4-2 | $(Mn_{1-x}Ni_{0.25})_3O_4 + 3/2 \times (Mn_2O_3)$ |
| Comparative Example 4-3 | $(Mn_{0.75}Ni_{0.25})(OH)_2$ |

| Examples and Comparative Examples | Compositional formula of nickel/manganese composite compound | | |
|---|---|---|---|
| | M element | y (mol %) | z (mol %) |
| Example 4-1 | — | 24.7 | — |
| Example 4-2 | Mg/Ti | 24.5 | Mg: 1.02/ Ti: 0.98 |
| Example 4-3 | Ti | 24.6 | 7.0 |
| Example 4-4 | — | 24.5 | — |
| Example 4-5 | — | 24.7 | — |
| Comparative Example 4-1 | — | 25.0 | — |
| Comparative Example 4-2 | — | — | — |
| Comparative Example 4-3 | — | 25.0 | — |

| Examples and Comparative Examples | Calcination temperature (° C.) | Average primary particle diameter (μm) | FWHM* of strongest peak | TD (tapped 500 times) (g/mL) |
|---|---|---|---|---|
| Example 4-1 | 950 | 2.6 | 0.20 | 2.12 |
| Example 4-2 | 950 | 2.5 | 0.21 | 2.11 |
| Example 4-3 | 950 | 2.7 | 0.19 | 1.90 |
| Example 4-4 | 920 | 2.4 | 0.23 | 2.01 |
| Example 4-5 | 1050 | 3.0 | 0.18 | 2.34 |
| Comparative Example 4-1 | — | 0.6 | 0.33 | 1.50 |
| Comparative Example 4-2 | 880 | 2.3 | 0.25 | 1.94 |
| Comparative Example 4-3 | — | 0.5 | 0.28 | 1.20 |

| Examples and Comparative Examples | Na content (ppm) | S content (ppm) | Total impurity content (ppm) |
|---|---|---|---|
| Example 4-1 | 252 | 88 | 1589 |
| Example 4-2 | 260 | 177 | 932 |
| Example 4-3 | 1679 | 490 | 2317 |
| Example 4-4 | 285 | 103 | 1106 |
| Example 4-5 | 124 | 72 | 1061 |
| Comparative Example 4-1 | 4948 | 85683 | 90831 |
| Comparative Example 4-2 | 218 | 215 | 1349 |
| Comparative Example 4-3 | 177 | 633 | 7568 |

Note:
FWHM*: Full-width at half maximum

TABLE 4-2

| Examples and Comparative Examples | Kind of precursor used | Li/ (Ni + Mn + M) (mol/mol) | Calcination temperature (1st) (° C.) | Calcination temperature (2nd) (° C.) |
|---|---|---|---|---|
| Example 4-6 | Example 4-1 | 0.50 | 750 | 600 |
| Example 4-7 | Example 4-2 | 0.50 | 750 | 600 |
| Example 4-8 | Example 4-3 | 0.50 | 850 | 600 |
| Example 4-9 | Example 4-1 | 0.50 | 900 | 600 |
| Example 4-10 | Example 4-5 | 0.50 | 750 | 600 |
| Comparative Example 4-4 | Comparative Example 4-1 | 0.48 | 1000 | 600 |
| Comparative Example 4-5 | Comparative Example 4-1 | 0.50 | 1000 | 600 |
| Comparative Example 4-6 | Comparative Example 4-1 | 0.51 | 1000 | 600 |
| Comparative Example 4-7 | Comparative Example 4-2 | 0.50 | 750 | 600 |
| Comparative Example 4-8 | Comparative Example 4-3 | 0.50 | 900 | 600 |

| Examples and Comparative Examples | Na content (ppm) | S content (ppm) | Total impurity content (ppm) | BET specific surface area (m²/g) |
|---|---|---|---|---|
| Example 4-6 | 95 | 18 | 513 | 0.43 |
| Example 4-7 | 242 | 100 | 660 | 0.53 |
| Example 4-8 | 1496 | 440 | 2369 | 0.48 |
| Example 4-9 | 49 | 32 | 481 | 0.29 |
| Example 4-10 | 226 | 61 | 662 | 0.53 |
| Comparative Example 4-4 | 7232 | 604 | 8236 | 0.50 |
| Comparative Example 4-5 | 7235 | 610 | 8245 | 0.54 |
| Comparative Example 4-6 | 7266 | 650 | 8316 | 0.56 |
| Comparative Example 4-7 | 145 | 43 | 1065 | 0.68 |
| Comparative Example 4-8 | 118 | 127 | 5005 | 0.71 |

| Examples and Comparative Examples | D50 (μm) | TD (tapped 500 times) (g/mL) | Battery characteristics | |
|---|---|---|---|---|
| | | | Discharge capacity at 3 V or more (mAh/g) | Discharge capacity at 4.5 V or more (mAh/g) |
| Example 4-6 | 15.1 | 1.95 | 140 | 132 |
| Example 4-7 | 9.1 | 2.08 | 140 | 132 |
| Example 4-8 | 10.4 | 2.11 | 137 | 128 |
| Example 4-9 | 13.6 | 1.80 | 135 | 127 |
| Example 4-10 | 9.5 | 2.24 | 144 | 137 |
| Comparative Example 4-4 | 15.4 | 1.89 | 139 | 122 |
| Comparative Example 4-5 | 15.4 | 1.96 | 136 | 122 |
| Comparative Example 4-6 | 15.2 | 1.98 | 136 | 120 |
| Comparative Example 4-7 | 14.0 | 1.90 | 133 | 118 |
| Comparative Example 4-8 | 14.1 | 1.75 | 125 | 106 |

| Examples and Comparative Examples | Battery characteristics | | |
|---|---|---|---|
| | Capacity (4.5 V-3 V) (mAh/g) | 10 C/0.1 C rate retention rate (%) | Cycle retention rate (full-cell: 200 cycles) (%) |
| Example 4-6 | 7 | 88 | 64 |
| Example 4-7 | 7 | 86 | 66 |
| Example 4-8 | 9 | 85 | 66 |
| Example 4-9 | 8 | 83 | 60 |
| Example 4-10 | 7 | 74 | 63 |

TABLE 4-2-continued

| | | | |
|---|---|---|---|
| Comparative Example 4-4 | 17 | 71 | 46 |
| Comparative Example 4-5 | 14 | 72 | 43 |
| Comparative Example 4-6 | 15 | 71 | 46 |
| Comparative Example 4-7 | 15 | 65 | 30 |
| Comparative Example 4-8 | 19 | 74 | 47 |

From the above results, it was confirmed that the positive electrode active substance particles comprising nickel-containing lithium manganate obtained by using the manganese/nickel composite oxide particles according to the present invention had large charge/discharge capacities and therefore were effective as excellent positive electrode active substance particles for non-aqueous electrolyte secondary batteries.

INDUSTRIAL APPLICABILITY

The positive electrode active substance particles according to the Inventions 1 and 4 have a large discharge capacity and excellent cycle characteristics, and are excellent in long-term stability owing to less occurrence of side reactions with an electrolyte solution, and therefore can be suitably used as positive electrode active substance particles for non-aqueous electrolyte secondary batteries.

When the manganese/nickel composite oxide particles according to the present invention are used as a precursor for synthesizing nickel-containing lithium manganate, positive electrode active substance particles obtained from the nickel-containing lithium manganate are capable of providing positive electrode active substance particles for non-aqueous electrolyte secondary batteries which have a high discharge capacity and excellent cycle characteristics. Therefore, the manganese/nickel composite oxide particles according to the present invention can be suitably used as a precursor of the positive electrode active substance.

The invention claimed is:

1. Positive electrode active substance particles for non-aqueous electrolyte secondary batteries having a spinel structure with a composition represented by the following chemical formula (1):

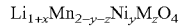  Chemical Formula (1):

wherein x, y, z fall within the range of $-0.05 \leq x \leq 0.15$, $0.4 \leq y \leq 0.6$ and $0 \leq z \leq 0.20$, respectively; and M is at least one element selected from the group consisting of Mg, Al, Si, Ca, Ti, Co, Zn, Sb, Ba, W and Bi, and wherein the positive electrode active substance particles have an average primary particle diameter of 1.0 to 4.0 μm, an average secondary particle diameter (D50) of 4 to 30 μm, and a BET specific surface area of 0.3 to 1.0 m²/g, and wherein a multiplication product of the average secondary particle diameter (D50) times the BET specific surface area of the positive electrode active substance particles is less than or equal to $10.0 \times 10^{-6}$ m³/g, and wherein the positive electrode active substance particles have a sodium content of 30 to 2000 ppm, a sulfur content of 10 to 600 ppm, and a total impurity content of not more than 5000 ppm.

2. The positive electrode active substance particles for non-aqueous electrolyte secondary batteries according to claim 1, wherein a full-width at half maximum z of a peak of a (400) plane as measured in X-ray diffraction of the positive electrode active substance particles is in the range of $z \leq 0.230°$.

3. The positive electrode active substance particles for non-aqueous electrolyte secondary batteries according to claim 1, wherein the positive electrode active substance particles have a tap density of not less than 1.7 g/mL (when tapped 500 times).

4. The positive electrode active substance particles for non-aqueous electrolyte secondary batteries according to claim 1, wherein the positive electrode active substance particles have a sodium content of 40 to 1700 ppm, a sulfur content of 15 to 500 ppm and a total impurity content of not more than 3500 ppm.

5. The positive electrode active substance particles for non-aqueous electrolyte secondary batteries according to claim 1, wherein the positive electrode active substance particles have an endotherm of 0.3 to 0.8 J/mg as measured by differential scanning calorimetry when heated from −40° C. to 70° C.

6. The positive electrode active substance particles for non-aqueous electrolyte secondary batteries according to claim 1, wherein when subjecting a non-aqueous electrolyte secondary battery produced using the positive electrode active substance particles to initial charging, a ratio of (b−a)/b in which a represents a battery capacity when charged up to 4.8 V and b is a battery capacity when charged up to 5.0 V is less than 10%.

7. The positive electrode active substance particles for non-aqueous electrolyte secondary batteries according to claim 1, wherein a non-aqueous electrolyte secondary battery produced using the positive electrode active substance particles has an initial charge/discharge efficiency of not less than 90%.

8. A process for producing the positive electrode active substance particles for non-aqueous electrolyte secondary batteries as defined in claim 1, comprising the steps of mixing a composite compound comprising Mn and Ni as main components with an Li compound; subjecting the resulting mixture to calcination step (1) in an oxidative atmosphere at a temperature of 680 to 1050° C.; and successively subjecting the calcined product to calcination step (2) at a temperature of 500 to 700° C.

9. A non-aqueous electrolyte secondary battery using the positive electrode active substance particles as defined in claim 1.

* * * * *